(12) United States Patent
Okhonin et al.

(10) Patent No.: US 8,295,078 B2
(45) Date of Patent: Oct. 23, 2012

(54) SEMICONDUCTOR MEMORY CELL AND ARRAY USING PUNCH-THROUGH TO PROGRAM AND READ SAME

(75) Inventors: Serguei Okhonin, Lausanne (CH); Mikhail Nagoga, Pully (CH)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/092,704

(22) Filed: Apr. 22, 2011

(65) Prior Publication Data
US 2011/0194363 A1 Aug. 11, 2011

Related U.S. Application Data

(63) Continuation of application No. 11/796,935, filed on Apr. 30, 2007, now Pat. No. 7,933,142.

(60) Provisional application No. 60/796,671, filed on May 2, 2006.

(51) Int. Cl.
*G11C 11/34* (2006.01)

(52) U.S. Cl. ........................................ 365/150; 365/181

(58) Field of Classification Search .................. 365/150, 365/185.03, 185.26, 149, 181, 182, 184; 257/297, 747, 361, 362, 348
See application file for complete search history.

(56) References Cited

U.S. PATENT DOCUMENTS

| | | | |
|---|---|---|---|
| 3,439,214 A | 4/1969 | Kabell | |
| 3,997,799 A | 12/1976 | Baker | |
| 4,032,947 A | 6/1977 | Kesel et al. | |
| 4,250,569 A | 2/1981 | Sasaki et al. | |
| 4,262,340 A | 4/1981 | Sasaki et al. | |
| 4,298,962 A | 11/1981 | Hamano et al. | |
| 4,371,955 A | 2/1983 | Sasaki | |
| 4,527,181 A | 7/1985 | Sasaki | |

(Continued)

FOREIGN PATENT DOCUMENTS

CA 272437 7/1927

(Continued)

OTHER PUBLICATIONS

Arimoto et al., A Configurable Enhanced T2RAM Macro for System-Level Power Management Unified Memory, 2006, VLSI Symposium.

(Continued)

*Primary Examiner* — Douglas King
(74) *Attorney, Agent, or Firm* — Wilmer Cutler Pickering Hale and Dorr LLP

(57) ABSTRACT

An integrated circuit device (for example, logic or discrete memory device) comprising a memory cell including a punch-through mode transistor, wherein the transistor includes a source region, a drain region, a gate, a gate insulator, and a body region having a storage node which is located, at least in part, immediately beneath the gate insulator. The memory cell includes at least two data states which are representative of an amount of charge in the storage node in the body region. First circuitry is coupled to the punch-through mode transistor of the memory cell to: (1) generate first and second sets of write control signals, and (2a) apply the first set of write control signals to the transistor to write a first data state in the memory cell and (2b) apply the second set of write control signals to the transistor to write a second data state in the memory cell. In response to the first set of write control signals, the punch-through mode transistor provides at least the first charge in the body region via impact ionization. The transistor may be disposed on a bulk-type substrate or SOI-type substrate.

20 Claims, 19 Drawing Sheets

U.S. PATENT DOCUMENTS

| | | |
|---|---|---|
| 4,630,089 A | 12/1986 | Sasaki et al. |
| 4,658,377 A | 4/1987 | McElroy |
| 4,791,610 A | 12/1988 | Takemae |
| 4,807,195 A | 2/1989 | Busch et al. |
| 4,954,989 A | 9/1990 | Auberton-Herve et al. |
| 4,979,014 A | 12/1990 | Hieda et al. |
| 5,010,524 A | 4/1991 | Fifield et al. |
| 5,144,390 A | 9/1992 | Matloubian |
| 5,164,805 A | 11/1992 | Lee |
| 5,258,635 A | 11/1993 | Nitayama et al. |
| 5,313,432 A | 5/1994 | Lin et al. |
| 5,315,541 A | 5/1994 | Harari et al. |
| 5,350,938 A | 9/1994 | Matsukawa |
| 5,355,330 A | 10/1994 | Hisamoto et al. |
| 5,388,068 A | 2/1995 | Ghoshal et al. |
| 5,397,726 A | 3/1995 | Bergemont et al. |
| 5,432,730 A | 7/1995 | Shubat et al. |
| 5,446,299 A | 8/1995 | Acovic et al. |
| 5,448,513 A | 9/1995 | Hu et al. |
| 5,466,625 A | 11/1995 | Hsieh et al. |
| 5,489,792 A | 2/1996 | Hu et al. |
| 5,506,436 A | 4/1996 | Hayashi et al. |
| 5,515,383 A | 5/1996 | Katoozi |
| 5,526,307 A | 6/1996 | Yiu et al. |
| 5,528,062 A | 6/1996 | Hsieh et al. |
| 5,568,356 A | 10/1996 | Schwartz |
| 5,583,808 A | 12/1996 | Brahmbhatt |
| 5,593,912 A | 1/1997 | Rajeevakumar |
| 5,606,188 A | 2/1997 | Bronner et al. |
| 5,608,250 A | 3/1997 | Kalnitsky |
| 5,627,092 A | 5/1997 | Alsmeier et al. |
| 5,631,186 A | 5/1997 | Park et al. |
| 5,677,867 A | 10/1997 | Hazani |
| 5,696,718 A | 12/1997 | Hartmann |
| 5,740,099 A | 4/1998 | Tanigawa |
| 5,754,469 A | 5/1998 | Hung et al. |
| 5,774,411 A | 6/1998 | Hsieh et al. |
| 5,778,243 A | 7/1998 | Aipperspach et al. |
| 5,780,906 A | 7/1998 | Wu et al. |
| 5,784,311 A | 7/1998 | Assaderaghi et al. |
| 5,798,968 A | 8/1998 | Lee et al. |
| 5,811,283 A | 9/1998 | Sun |
| 5,847,411 A | 12/1998 | Morii |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,968,840 A | 10/1999 | Park et al. |
| 5,977,578 A | 11/1999 | Tang |
| 5,982,003 A | 11/1999 | Hu et al. |
| 5,986,914 A | 11/1999 | McClure |
| 6,018,172 A | 1/2000 | Hidada et al. |
| 6,048,756 A | 4/2000 | Lee et al. |
| 6,081,443 A | 6/2000 | Morishita |
| 6,096,598 A | 8/2000 | Furukawa et al. |
| 6,097,056 A | 8/2000 | Hsu et al. |
| 6,097,624 A | 8/2000 | Chung et al. |
| 6,111,778 A | 8/2000 | MacDonald et al. |
| 6,121,077 A | 9/2000 | Hu et al. |
| 6,133,597 A | 10/2000 | Li et al. |
| 6,157,216 A | 12/2000 | Lattimore et al. |
| 6,171,923 B1 | 1/2001 | Chi et al. |
| 6,177,300 B1 | 1/2001 | Houston et al. |
| 6,177,698 B1 | 1/2001 | Gruening et al. |
| 6,177,708 B1 | 1/2001 | Kuang et al. |
| 6,214,694 B1 | 4/2001 | Leobandung et al. |
| 6,222,217 B1 | 4/2001 | Kunikiyo |
| 6,225,158 B1 | 5/2001 | Furukawa et al. |
| 6,245,613 B1 | 6/2001 | Hsu et al. |
| 6,252,281 B1 | 6/2001 | Yamamoto et al. |
| 6,262,935 B1 | 7/2001 | Parris et al. |
| 6,292,424 B1 | 9/2001 | Ohsawa |
| 6,297,090 B1 | 10/2001 | Kim |
| 6,300,649 B1 | 10/2001 | Hu et al. |
| 6,320,227 B1 | 11/2001 | Lee et al. |
| 6,333,532 B1 | 12/2001 | Davari et al. |
| 6,333,866 B1 | 12/2001 | Ogata |
| 6,350,653 B1 | 2/2002 | Adkisson et al. |
| 6,351,426 B1 | 2/2002 | Ohsawa |
| 6,359,802 B1 | 3/2002 | Lu et al. |
| 6,384,445 B1 | 5/2002 | Hidaka et al. |
| 6,391,658 B1 | 5/2002 | Gates et al. |
| 6,403,435 B1 | 6/2002 | Kang et al. |
| 6,421,269 B1 | 7/2002 | Somasekhar et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,432,769 B1 | 8/2002 | Fukuda et al. |
| 6,440,872 B1 | 8/2002 | Mandelman et al. |
| 6,441,435 B1 | 8/2002 | Chan |
| 6,441,436 B1 | 8/2002 | Wu et al. |
| 6,466,511 B2 | 10/2002 | Fujita et al. |
| 6,479,862 B1 | 11/2002 | King et al. |
| 6,480,407 B1 | 11/2002 | Keeth |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,537,871 B2 | 3/2003 | Forbes |
| 6,538,916 B2 | 3/2003 | Ohsawa |
| 6,544,837 B1 | 4/2003 | Divakaruni et al. |
| 6,548,848 B2 | 4/2003 | Horiguchi et al. |
| 6,549,450 B1 | 4/2003 | Hsu et al. |
| 6,552,398 B2 | 4/2003 | Hsu et al. |
| 6,552,932 B1 | 4/2003 | Cernea |
| 6,556,477 B2 | 4/2003 | Hsu et al. |
| 6,560,142 B1 | 5/2003 | Ando |
| 6,563,733 B2 | 5/2003 | Liu et al. |
| 6,566,177 B1 | 5/2003 | Radens et al. |
| 6,567,330 B2 | 5/2003 | Fujita et al. |
| 6,573,566 B2 | 6/2003 | Ker et al. |
| 6,574,135 B1 | 6/2003 | Komatsuzaki |
| 6,590,258 B2 | 7/2003 | Divakauni et al. |
| 6,590,259 B2 | 7/2003 | Adkisson et al. |
| 6,617,651 B2 | 9/2003 | Ohsawa |
| 6,621,725 B2 | 9/2003 | Ohsawa |
| 6,632,723 B2 | 10/2003 | Watanabe et al. |
| 6,650,565 B1 | 11/2003 | Ohsawa |
| 6,653,175 B1 | 11/2003 | Nemati et al. |
| 6,686,624 B2 | 2/2004 | Hsu |
| 6,703,673 B2 | 3/2004 | Houston |
| 6,707,118 B2 | 3/2004 | Muljono et al. |
| 6,714,436 B1 | 3/2004 | Burnett et al. |
| 6,721,222 B2 | 4/2004 | Somasekhar et al. |
| 6,825,524 B1 | 11/2004 | Ikehashi et al. |
| 6,861,689 B2 | 3/2005 | Burnett |
| 6,870,225 B2 | 3/2005 | Bryant et al. |
| 6,882,566 B2 | 4/2005 | Nejad et al. |
| 6,888,770 B2 | 5/2005 | Ikehashi |
| 6,894,913 B2 | 5/2005 | Yamauchi |
| 6,897,098 B2 | 5/2005 | Hareland et al. |
| 6,903,984 B1 | 6/2005 | Tang et al. |
| 6,909,151 B2 | 6/2005 | Hareland et al. |
| 6,912,150 B2 | 6/2005 | Portmann et al. |
| 6,913,964 B2 | 7/2005 | Hsu |
| 6,936,508 B2 | 8/2005 | Visokay et al. |
| 6,969,662 B2 | 11/2005 | Fazan et al. |
| 6,975,536 B2 | 12/2005 | Maayan et al. |
| 6,982,902 B2 | 1/2006 | Gogl et al. |
| 6,987,041 B2 | 1/2006 | Ohkawa |
| 7,030,436 B2 | 4/2006 | Forbes |
| 7,037,790 B2 | 5/2006 | Chang et al. |
| 7,041,538 B2 | 5/2006 | Ieong et al. |
| 7,042,765 B2 | 5/2006 | Sibigtroth et al. |
| 7,061,806 B2 | 6/2006 | Tang et al. |
| 7,085,153 B2 | 8/2006 | Ferrant et al. |
| 7,085,156 B2 | 8/2006 | Ferrant et al. |
| 7,170,807 B2 | 1/2007 | Fazan et al. |
| 7,177,175 B2 | 2/2007 | Fazan et al. |
| 7,187,581 B2 | 3/2007 | Ferrant et al. |
| 7,230,846 B2 | 6/2007 | Keshavarzi |

| | | |
|---|---|---|
| 7,233,024 B2 | 6/2007 | Scheuerlein et al. |
| 7,256,459 B2 | 8/2007 | Shino |
| 7,301,803 B2 | 11/2007 | Okhonin et al. |
| 7,301,838 B2 | 11/2007 | Waller |
| 7,317,641 B2 | 1/2008 | Scheuerlein |
| 7,324,387 B1 | 1/2008 | Bergemont et al. |
| 7,335,934 B2 | 2/2008 | Fazan |
| 7,341,904 B2 | 3/2008 | Willer |
| 7,416,943 B2 | 8/2008 | Figura et al. |
| 7,456,439 B1 | 11/2008 | Horch |
| 7,477,540 B2 | 1/2009 | Okhonin et al. |
| 7,492,632 B2 | 2/2009 | Carman |
| 7,517,744 B2 | 4/2009 | Mathew et al. |
| 7,539,041 B2 | 5/2009 | Kim et al. |
| 7,542,340 B2 | 6/2009 | Fisch et al. |
| 7,542,345 B2 | 6/2009 | Okhonin et al. |
| 7,545,694 B2 | 6/2009 | Srinivasa Raghavan et al. |
| 7,606,066 B2 | 10/2009 | Okhonin et al. |
| 7,696,032 B2 | 4/2010 | Kim et al. |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0042516 A1 | 3/2003 | Forbes et al. |
| 2003/0047784 A1 | 3/2003 | Matsumoto et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146474 A1 | 8/2003 | Ker et al. |
| 2003/0146488 A1 | 8/2003 | Nagano et al. |
| 2003/0151112 A1 | 8/2003 | Yamada et al. |
| 2003/0231521 A1 | 12/2003 | Ohsawa |
| 2004/0021137 A1 | 2/2004 | Fazan et al. |
| 2004/0021179 A1 | 2/2004 | Lee |
| 2004/0029335 A1 | 2/2004 | Lee et al. |
| 2004/0075143 A1 | 4/2004 | Bae et al. |
| 2004/0108532 A1 | 6/2004 | Forbes et al. |
| 2004/0188714 A1 | 9/2004 | Scheuerlein et al. |
| 2004/0217420 A1 | 11/2004 | Yeo et al. |
| 2005/0001257 A1 | 1/2005 | Schloesser et al. |
| 2005/0001269 A1 | 1/2005 | Hayashi et al. |
| 2005/0017240 A1 | 1/2005 | Fazan |
| 2005/0047240 A1 | 3/2005 | Ikehashi et al. |
| 2005/0062088 A1 | 3/2005 | Houston |
| 2005/0063224 A1 | 3/2005 | Fazan et al. |
| 2005/0064659 A1 | 3/2005 | Willer |
| 2005/0105342 A1 | 5/2005 | Tang et al. |
| 2005/0111255 A1 | 5/2005 | Tang et al. |
| 2005/0121710 A1 | 6/2005 | Shino |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0208716 A1 | 9/2005 | Takaura et al. |
| 2005/0226070 A1 | 10/2005 | Ohsawa |
| 2005/0232043 A1 | 10/2005 | Ohsawa |
| 2005/0242396 A1 | 11/2005 | Park et al. |
| 2005/0265107 A1 | 12/2005 | Tanaka |
| 2006/0043484 A1 | 3/2006 | Cabral et al. |
| 2006/0084247 A1 | 4/2006 | Liu |
| 2006/0091462 A1 | 5/2006 | Okhonin et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2006/0223302 A1 | 10/2006 | Chang et al. |
| 2007/0008811 A1 | 1/2007 | Keeth et al. |
| 2007/0023833 A1 | 2/2007 | Okhonin et al. |
| 2007/0045709 A1 | 3/2007 | Yang |
| 2007/0058427 A1 | 3/2007 | Okhonin et al. |
| 2007/0064489 A1 | 3/2007 | Bauser |
| 2007/0085140 A1 | 4/2007 | Bassin |
| 2007/0097751 A1 | 5/2007 | Popoff et al. |
| 2007/0114599 A1 | 5/2007 | Hshieh |
| 2007/0133330 A1 | 6/2007 | Ohsawa |
| 2007/0138524 A1 | 6/2007 | Kim et al. |
| 2007/0138530 A1 | 6/2007 | Okhonin et al. |
| 2007/0187751 A1 | 8/2007 | Hu et al. |
| 2007/0187775 A1 | 8/2007 | Okhonin et al. |
| 2007/0200176 A1 | 8/2007 | Kammler et al. |
| 2007/0252205 A1 | 11/2007 | Hoentschel et al. |
| 2007/0263466 A1 | 11/2007 | Morishita et al. |
| 2007/0278578 A1 | 12/2007 | Yoshida |
| 2008/0049486 A1 | 2/2008 | Gruening-von Schwerin |
| 2008/0083949 A1 | 4/2008 | Zhu et al. |
| 2008/0099808 A1 | 5/2008 | Burnett et al. |
| 2008/0130379 A1 | 6/2008 | Ohsawa |
| 2008/0133849 A1 | 6/2008 | Demi et al. |
| 2008/0165577 A1 | 7/2008 | Fazan et al. |
| 2008/0253179 A1 | 10/2008 | Slesazeck |
| 2008/0258206 A1 | 10/2008 | Hofmann |
| 2009/0086535 A1 | 4/2009 | Ferrant et al. |
| 2009/0121269 A1 | 5/2009 | Caillat et al. |
| 2009/0127592 A1 | 5/2009 | El-Kareh et al. |
| 2009/0201723 A1 | 8/2009 | Okhonin et al. |
| 2010/0085813 A1 | 4/2010 | Shino |
| 2010/0091586 A1 | 4/2010 | Carman |
| 2010/0110816 A1 | 5/2010 | Nautiyal et al. |

FOREIGN PATENT DOCUMENTS

| | | |
|---|---|---|
| EP | 2 197 494 | 3/1974 |
| EP | 0 030 856 | 6/1981 |
| EP | 0 350 057 | 1/1990 |
| EP | 0 354 348 | 2/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |
| EP | 0 245 515 | 4/1997 |
| EP | 0 788 165 | 8/1997 |
| EP | 0 801 427 | 10/1997 |
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |
| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |

| | | |
|---|---|---|
| EP | 0 601 590 | 4/2000 |
| EP | 0 993 037 | 4/2000 |
| EP | 0 836 194 | 5/2000 |
| EP | 0 599 388 | 8/2000 |
| EP | 0 689 252 | 8/2000 |
| EP | 0 606 758 | 9/2000 |
| EP | 0 682 370 | 9/2000 |
| EP | 1 073 121 | 1/2001 |
| EP | 0 726 601 | 9/2001 |
| EP | 0 731 972 | 11/2001 |
| EP | 1 162 663 | 12/2001 |
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| GB | 1 414 228 | 11/1975 |
| JP | H04-176163 A | 6/1922 |
| JP | S62-007149 A | 1/1987 |
| JP | S62-272561 | 11/1987 |
| JP | 02-294076 | 12/1990 |
| JP | 03-171768 | 7/1991 |
| JP | 05-347419 | 12/1993 |
| JP | 08-213624 | 8/1996 |
| JP | H08-213624 A | 8/1996 |
| JP | 08-274277 | 10/1996 |
| JP | H08-316337 A | 11/1996 |
| JP | 09-046688 | 2/1997 |
| JP | 09-082912 | 3/1997 |
| JP | 10-242470 | 9/1998 |
| JP | 11-087649 | 3/1999 |
| JP | 2000-247735 A | 8/2000 |
| JP | 12-274221 A | 9/2000 |
| JP | 12-389106 A | 12/2000 |
| JP | 13-180633 A | 6/2001 |
| JP | 2002-009081 | 1/2002 |
| JP | 2002-083945 | 3/2002 |
| JP | 2002-094027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-031693 | 1/2003 |
| JP | 2003-68877 A | 3/2003 |
| JP | 2003-086712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |
| JP | 2004-335553 | 11/2004 |
| WO | WO 01/24268 | 4/2001 |
| WO | WO 2005/008778 | 1/2005 |

OTHER PUBLICATIONS

Arimoto, A High-Density Scalable Twin Transistor RAM (TTRAM) With Verify Control for SOI Platform Memory IPs, Nov. 2007, Solid-State Circuits.

Asian Technology Information Program (ATIP) Scoops™, "Novel Capacitorless 1T-DRAM From Single-Gate PD-SOI to Double-Gate FinDRAM", May 9, 2005, 9 pages.

Assaderaghi et al., "A Dynamic Threshold Voltage MOSFET (DTMOS) for Ultra-Low Voltage Operation", IEEE IEDM, 1994, pp. 809-812.

Assaderaghi et al., "A Dynamic Threshold Voltage MOSFET (DTMOS) for Very Low Voltage Operation", IEEE Electron Device Letters, vol. 15, No. 12, Dec. 1994, pp. 510-512.

Assaderaghi et al., "A Novel Silicon-On-Insulator (SOI) MOSFET for Ultra Low Voltage Operation", 1994 IEEE Symposium on Low Power Electronics, pp. 58-59.

Assaderaghi et al., "Dynamic Threshold-Voltage MOSFET (DTMOS) for Ultra-Low Voltage VLSI", IEEE Transactions on Electron Devices, vol. 44, No. 3, Mar. 1997, pp. 414-422.

Assaderaghi et al., "High-Field Transport of Inversion-Layer Electrons and Holes Including Velocity Overshoot", IEEE Transactions on Electron Devices, vol. 44, No. 4, Apr. 1997, pp. 664-671.

Avci, Floating Body Cell (FBC) Memory for 16-nm Technology with Low Variation on Thin Silicon and 10-nm BOX, Oct. 2008, SOI Conference.

Bae, Evaluation of 1T RAM using Various Operation Methods with SOONO (Silicon-On-ONO) device, Dec. 2008, IEDM.

Ban et al., Integration of Back-Gate Doping for 15-nm Node Floating Body Cell (FBC) Memory, Components Research, Process Technology Modeling, presented in the 2010 VLSI Symposium on Jun. 17, 2010.

Ban, A Scaled Floating Body Cell (FBC) Memory with High-k+Metal Gate on Thin-Silicon and Thin-BOX for 16-nm Technology Node and Beyond, Jun. 2008, VLSI Symposium.

Ban, Ibrahim, et al., "Floating Body Cell with Independently-Controlled Double Gates for High Density Memory," Electron Devices Meeting, 2006. IEDM '06, International, IEEE, Dec. 11-13, 2006.

Bawedin, Maryline, et al., A Capacitorless 1T Dram on SOI Based on Dynamic Coupling and Double-Gate Operation, IEEE Electron Device Letters, vol. 29, No. 7, Jul. 2008.

Blagojevic et al., Capacitorless 1T DRAM Sensing Scheme Automatice Reference Generation, 2006, IEEE J.Solid State Circuits.

Blalock, T., "A High-Speed Clamped Bit-Line Current-Mode Sense Amplifier", IEEE Journal of Solid-State Circuits, vol. 26, No. 4, Apr. 1991, pp. 542-548.

Butt, Scaling Limits of Double Gate and Surround Gate Z-RAM Cells, 2007, IEEE Trans. on El. Dev.

Chan et al., "Effects of Floating Body on Double Polysilicon Partially Depleted SOI Nonvolatile Memory Cell", IEEE Electron Device Letters, vol. 24, No. 2, Feb. 2003, pp. 75-77.

Chan, et al., "SOI MOSFET Design for All-Dimensional Scaling with Short Channel, Narrow Width and Ultra-thin Films", IEEE IEDM, 1995, pp. 631-634.

Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.

Cho et al., "Novel DRAM Cell with Amplified Capacitor for Embedded Application", IEEE, Jun. 2009.

Cho, A novel capacitor-less DRAM cell using Thin Capacitively-Coupled Thyristor (TCCT), 2005, IEDM.

Choi et al., Current Flow Mechanism in Schottky-Barrier MOSFET and Application to the 1T-DRAM, 2008, SSDM.

Choi, High Speed Flash Memory and 1T-DRAM on Dopant Segregated Schottky Barrier (DSSB) FinFET SONOS Device for Multi-functional SoC Applications, Dec. 2008, IEDM.

Clarke, Junctionless Transistors Could Simply Chip Making, Say Researchers, EE Times, Feb. 2010, www.eetimes.com/showArticle.jhtml?articleID=223100050.

Colinge, J.P., "An SOI voltage-controlled bipolar-MOS device", IEEE Transactions on Electron Devices, vol. ED-34, No. 4, Apr. 1987, pp. 845-849.

Colinge, Nanowire Transistors Without Junctions, Nature NanoTechnology, vol. 5, 2010, pp. 225-229.

Collaert et al., Optimizing the Readout Bias for the Capacitorless 1T Bulk FinFET RAM Cell, 2009, IEEE EDL.

Collaert, Comparison of scaled floating body RAM architectures, Oct. 2008, SOI Conference.

Ershov, Optimization of Substrate Doping for Back-Gate Control in SOI T-RAM Memory Technology, 2005, SOI Conference.

Ertosun et al., A Highly Scalable Capacitorless Double Gate Quantum Well Single Transistor DRAM: 1T-QW DRAM, 2008, IEEE EDL.

Fazan et al., "A Simple 1-Transistor Capacitor-Less Memory Cell for High Performance Embedded DRAMs", IEEE 2002 Custom Integrated Circuits Conference, Jun. 2002, pp. 99-102.

Fazan, A Highly Manufacturable Capacitor-less 1T-DRAM Concept, 2002, SPIE.

Fazan, et al., "Capacitor-Less 1-Transistor DRAM", 2002 IEEE International SOI Conference, Oct. 2002, pp. 10-13.

Fazan, P., "MOSFET Design Simplifies DRAM", EE Times, May 14, 2002 (3 pages).

Fisch, Beffa, Bassin, Soft Error Performance of Z-RAM Floating Body Memory, 2006, SOI Conference.

Fisch, Carman, Customizing SOI Floating Body Memory Architecture for System Performance and Lower Cost, 2006, SAME.

Fisch, Z-RAM® Ultra-Dense Memory for 90nm and Below, 2006, Hot Chips.

Fossum et al., New Insights on Capacitorless Floating Body DRAM Cells, 2007, IEEE EDL.

Fujita, Array Architectureof Floating Body Cell (FBC) with Quasi-Shielded Open Bit Line Scheme for sub-40nm Node, 2008, SOI Conference.

Furuhashi, Scaling Scenario of Floating Body Cell (FBC) Suppressing Vth Variation Due to Random Dopant Fluctuation, Dec. 2008, SOI Conference.

Furuyama et al., "An Experimental 2-bit/Cell Storage DRAM for Macrocell or Memory-on-Logic Application", IEEE Journal of Solid-State Circuits, vol. 24, No. 2, Apr. 1989, pp. 388-393.

Giffard et al., "Dynamic Effects in SOI MOSFET's", IEEE, 1991, pp. 160-161.

Gupta et al., SPICE Modeling of Self Sustained Operation (SSO) to Program Sub-90nm Floating Body Cells, Oct. 2009, Conf on Simulation of Semiconductor Processes & Devices.

Han et al., Bulk FinFET Unified-RAM (URAM) Cell for Multifunctioning NVM and Capacitorless 1T-DRAM, 2008, IEEE EDL.

Han et al., Partially Depleted SONOS FinFET for Unified RAM (URAM) Unified Function for High-Speed 1T DRAM and Nonvolatile Memory, 2008, IEEE EDL.

Han, Energy Band Engineered Unified-RAM (URAM) for Multi-Functioning 1T-DRAM and NVM, Dec. 2008, IEDM.

Han, Parasitic BJT Read Method for High-Performance Capacitorless 1T-DRAM Mode in Unified RAM, Oct. 2009, IEEE EDL.

Hara, Y., "Toshiba's DRAM Cell Piggybacks on SOI Wafer", EE Times, Jun. 2003.

Hu, C., "SOI (Silicon-on-Insulator) for High Speed Ultra Large Scale Integration", Jpn. J. Appl. Phys. vol. 33 (1994) pp. 365-369, Part 1, No. 1B, Jan. 1994.

Idei et al., "Soft-Error Characteristics in Bipolar Memory Cells with Small Critical Charge", IEEE Transactions on Electron Devices, vol. 38, No. 11, Nov. 1991, pp. 2465-2471.

Ikeda et al., "3-Dimensional Simulation of Turn-off Current in Partially Depleted SOI MOSFETs", IEIC Technical Report, Institute of Electronics, Information and Communication Engineers, 1998, vol. 97, No. 557 (SDM97 186-198), pp. 27-34.

Inoh et al., "FBC (Floating Body Cell) for Embedded DRAM on SOI", 2003 Symposium on VLSI Circuits Digest of Technical Papers, Jun. 2003 (2 pages).

Iyer et al., "SOI MOSFET on Low Cost SPIMOX Substrate", IEEE IEDM, Sep. 1998, pp. 1001-1004.

Jang et al., Highly scalable Z-RAM with remarkably long data retention for DRAM application, Jun. 2009, VLSI.

Jeong et al., "A Capacitor-less 1T DRAM Cell Based on a Surrounding Gate MOSFET with Vertical Channel", Technology Development Team, Technology Development Team, Samsung Electronics Co., Ltd., May 2007.

Jeong et al., "A New Capacitorless 1T DRAm Cell: Surrounding Gate MOSFET with Vertical Channel (SGVC Cell)", IEEE Transactions on Nanotechnology, vol. 6, No. 3, May 2007.

Jeong et al., "Capacitorless DRAM Cell with Highly Scalable Surrounding Gate Structure", Extended Abstracts of the 2006 International Conference on Solid State Devices and Materials, pp. 574-575, Yokohama (2006).

Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).

Kedzierski, J.; "Design Analysis of Thin-Body Silicide Source/Drain Devices", 2001 IEEE International SOI Conference, Oct. 2001, pp. 21-22.

Kim et al., "Chip Level Reliability on SOI Embedded Memory", Proceedings 1998 IEEE International SOI Conference, Oct. 1998, pp. 135-139.

Kuo et al., "A Capacitorless Double-Gate DRAM Cell Design for High Density Applications", IEEE IEDM, Feb. 2002, pp. 843-846.

Kuo et al., "A Capacitorless Double-Gate DRAM Cell", IEEE Electron Device Letters, vol. 23, No. 6, Jun. 2002, pp. 345-347.

Kuo et al., A Capacitorless Double Gate DRAM Technology for Sub 100 nm Embedded and Stand Alone Memory Applications, 2003, IEEE Trans. on El. Dev.

Kwon et al., "A Highly Scalable 4F2 DRAm Cell Utilizing a Doubly Gated Vertical Channel", Extended Abstracts of the 2009 International Conference on Solid State Devices and Materials, UC Berkley, pp. 142-143 Sendai (2009).

Lee et al., "A Novel Pattern Transfer Process for Bonded SOI Gigabit DRAMs", Proceedings 1996 IEEE International SOI Conference, Oct. 1996, pp. 114-115.

Leiss et al., dRAM Design Using the Taper-Isolated Dynamic RAM Cell, IEEE Transactions on Electron Devices, vol. ED-29, No. 4, Apr. 1982, pp. 707-714.

Lin et al., "Opposite Side Floating Gate SOI FLASH Memory Cell", IEEE, Mar. 2000, pp. 12-15.

Liu et al., Surface Generation-Recombination Processes of Gate and STI Oxide Interfaces Responsible for Junction Leakage on SOI, Sep. 2009, ECS Transactions, vol. 25.

Liu, Surface Recombination-Generation Processes of Gate, STI and Buried Oxide Interfaces, Responsible for Junction Leakage, ICSI, May 19, 2009.

Lončar et al., "One of Application of SOI Memory Cell—Memory Array", IEEE Proc. 22nd International Conference on Microelectronics (MIEL 2000), vol. 2, NIS, Serbia, May 14-17, 2000, pp. 455-458.

Lu et al., A Novel Two-Transistor Floating Body/Gate Cell for Low Power Nanoscale Embedded DRAM, 2008, IEEE Trans. on El. Dev.

Ma, et al., "Hot-Carrier Effects in Thin-Film Fully Depleted SOI MOSFET's", IEEE Electron Device Letters, vol. 15, No. 6, Jun. 1994, pp. 218-220.

Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.

Malinge, An 8Mbit DRAM Design Using a 1TBulk Cell, 2005, VLSI Circuits.

Mandelman et al, "Floating-Body Concerns for SOI Dynamic Random Access Memory (DRAM)", Proceedings 1996 IEEE International SOI Conference, Oct. 1996, pp. 136-137.

Matsuoka et al., FBC Potential of 6F2 Single Cell Operation in Multi Gbit Memories Confirmed by a Newly Developed Method for Measuring Signal Sense Margin, 2007, IEDM.

Minami, A Floating Body Cell (FBC) fully Compatible with 90nm CMOS Technology(CMOS IV) for 128Mb SOI DRAM, 2005, IEDM.

Mohapatra et al., Effect of Source/Drain Asymmetry on the Performance of Z-RAMÒ Devices, Oct. 2009, SOI conference.

Morishita, A Capacitorless Twin-Transistor Random Access Memory (TTRAM) on SOI, 2005, CICC.

Morishita, F. et al., "A Configurable Enhanced TTRAM Macro for System-Level Power Management Unified Memory", IEEE Journal of Solid-State Circuits, vol. 42, No. 4, pp. 853, Apr. 2007.

Morishita, F., et al., "A 312-MHz 16-Mb Random-Cycle Embedded DRAM Macro With a Power-Down Data Retention Mode for Mobile Applications", J. Solid-State Circuits, vol. 40, No. 1, pp. 204-212, 2005.

Morishita, F., et al., "Dynamic floating body control SOI CMOS for power managed multimedia ULSIs", Proc. CICC, pp. 263-266, 1997.

Morishita, F., et al., "Leakage Mechanism due to Floating Body and Countermeasure on Dynamic Retention Mode of SOI-DRAM", Symposium on VLSI Technology Digest of Technical Papers, pp. 141-142, 1995.

Nagoga, Studying of Hot Carrier Effect in Floating Body Soi Mosfets by the Transient Charge Pumping Technique, Switzerland 2003.

Nayfeh, A Leakage Current Model for SOI based Floating Body Memory that Includes the Poole-Frenkel Effect, 2008, SOI Conference.

Nemati, A Novel High Density, Low Voltage SRAM Cell with a Vertical NDR Device, 1998, VLSI Tech. Symp.

Nemati, A Novel Thyristor-based SRAM Cell (T-RAM) for High-Speed, Low-Voltage, Giga-scale Memories, 1999, IEDM Conference.

Nemati, Embedded Volatile Memories-Embedded Tutorial: The New Memory Revolution, New Drives Circuits and Systems, ICCAD 2008, Nov. 2008.

Nemati, Fully Planar 0.562μm2 T-RAM Cell in a 130nm SOI CMOS Logic Technology for High-Density High-Performance SRAMs, 2004, IEDM.

Nemati, The New Memory Revolution. New Devices, Circuits and Systems, 2008, ICCAD.

Nemati, Thyristor RAM (T-RAM): A High-Speed High-Density Embedded Memory Technology for Nano-scale CMOS, 2007, Hot Chips.

Nemati, Thyristor-RAM: A Novel Embedded Memory Technology that Outperforms Embedded S RAM/DRAM, 2008, Linley Tech Tour.

Nishiguchi et al., Long Retention of Gain-Cell Dynamic Random Access Memory with Undoped Memory Node, 2007, IEEE EDL.

Oh, Floating Body DRAM Characteristics of Silicon-On-ONO (SOONO) Devices for System-on-Chip (SoC) Applications, 2007, VLSI Symposium.

Ohno et al., "Suppression of Parasitic Bipolar Action in Ultra-Thin-Film Fully-Depleted CMOS/SIMOX Devices by Ar-Ion Implantation into Source/Drain Regions", IEEE Transactions on Electron Devices, vol. 45, No. 5, May 1998, pp. 1071-1076.

Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).

Ohsawa et al., "Memory Design Using a One-Transistor Gain Cell on SOI", IEEE Journal of Solid-State Circuits, vol. 37, No. 11, Nov. 2002, pp. 1510-1522.

Ohsawa, A 128Mb Floating Body RAM (FBRAM) on SOI with a Multi-Averaging Scheme of Dummy Cell, 2006 Symposium of VLSI Circuits Digest of Tech Papers, (2006).

Ohsawa, An 18.5ns 128Mb SOI DRAM with a Floating Body Cell, 2005, ISSCC.

Ohsawa, Autonomous Refresh of Floating Body Cell (FBC), Dec. 2008, IEDM.

Ohsawa, Design of a 128-Mb SOI DRAM Using the Floating Body Cell (FBC), Jan. 2006, Solid-State Circuits.

Okhonin, A Capacitor-Less 1T-DRAM Cell, Feb. 2002, Electron Device Letters.

Okhonin, A SOI Capacitor-less 1T-DRAM Concept, 2001, SOI Conference.

Okhonin, Charge Pumping Effects in Partially Depleted SOI MOSFETs, 2003, SOI Conference.

Okhonin, New characterization techniques for SOI and related devices, 2003, ECCTD.

Okhonin, New Generation of Z-RAM, 2007, IEDM.

Okhonin, Principles of Transient Charge Pumping on Partially Depleted SOI MOSFETs, May 2002, Electron Device Letters.

Okhonin, Transient Charge Pumping for Partially and Fully Depleted SOI MOSFETs, 2002, SOI Conference.

Okhonin, Transient effects in PD SOI MOSFETs and potential DRAM applications, 2002, Solid-State Electronics.

Okhonin, Ultra-scaled Z-RAM cell, 2008, SOI Conference.

Okhonin, Z-RAM® (Limits of DRAM), 2009, ESSDERC.

Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008.

Park, Fully Depleted Double-Gate 1T-DRAM Cell with NVM Function for High Performance and High Density Embedded DRAM, 2009, IMW.

Pelella et al., "Low-Voltage Transient Bipolar Effect Induced by Dynamic Floating-Body Charging in PD/SOI MOSFETs", Final Camera Ready Art, SOI Conference, Oct. 1995, 2 pages.

Portmann et al., "A SOI Current Memory for Analog Signal Processing at High Temperature", 1999 IEEE International SOI Conference, Oct. 1999, pp. 18-19.

Puget et al., 1T Bulk eDRAM using GIDL Current for High Speed and Low Power applications, 2008, SSDM.

Puget et al., Quantum effects influence on thin silicon film capacitor-less DRAM performance, 2006, SOI Conference.

Puget, FDSOI Floating Body Cell eDRAM Using Gate-Induced Drain-Leakage (GIDL) Write Current for High Speed and Low Power Applications, 2009, IMW.

Ranica et al., 1T-Bulk DRAM cell with improved performances: the way to scaling, 2005, ICMTD.

Ranica, A capacitor-less DRAM cell on 75nm gate length, 16nm thin Fully Depleted SOI device for high density embedded memories, 2004, IEDM.

Ranica, A One Transistor Cell on Bulk Substrate (1T-Bulk) for Low-Cost and High Density eDRAM, 2004, VLSI Symposium.

Rodder et al., "Silicon-On-Insulator Bipolar Transistors", IEEE Electron Device Letters, vol. EDL-4, No. 6, Jun. 1983, pp. 193-195.

Rodriguez, Noel, et al., A-RAM Novel Capacitor-less Dram Memory, SOI Conference, 2009 IEEE International, Oct. 5-8, 2009 pp. 1-2.

Roy, Thyristor-Based Volatile Memory in Nano-Scale CMOS, 2006, ISSCC.

Salling et al., Reliability of Thyristor Based Memory Cells, 2009, IRPS.

Sasaki et al., Charge Pumping in SOS-MOS Transistors, 1981, IEEE Trans. on El. Dev.

Sasaki et al., Charge Pumping SOS-MOS Transistor Memory, 1978, IEDM.

Schloesser et al., "A 6F2 Buried Wordline DRAM Cell for 40nm and Beyond", IEEE, Qimonda Dresden GmbH & Co., pp. 809-812 (2008).

Shino et al., Floating Body RAM technology and its scalability to 32 nm node and beyond, 2006, IEDM.

Shino et al., Operation Voltage Dependence of Memory Cell Characteristics in Fully Depleted FBC, 2005, IEEE Trans. on El. Dev.

Shino, Fully-Depleted FBC (Floating Body Cell) with Enlarged Signal Window and Excellent Logic Process Compatibility, 2004, IEDM.

Shino, Highly Scalable FBC (Floating Body Cell) with 25nm BOX Structure for Embedded DRAM Applications, 2004, VLSI Symposium.

Sim et al., "Source-Bias Dependent Charge Accumulation in P+-Poly Gate SOI Dynamic Random Access Memory Cell Transistors", Jpn. J. Appl. Phys. vol. 37 (1998) pp. 1260-1263, Part 1, No. 3B, Mar. 1998.

Singh, A 2ns-Read-Latency 4Mb Embedded Floating-Body Memory Macro in 45nm SOI Technology, Feb. 2009, ISSCC.

Sinha et al., "In-Depth Analysis of Opposite Channel Based Charge Injection in SOI MOSFETs and Related Defect Creation and Annihilation", Elsevier Science, Microelectronic Engineering 28, 1995, pp. 383-386.

Song, 55 nm Capacitor-less 1T DRAM Cell Transistor with Non-Overlap Structure, Dec. 2008, IEDM.

Stanojevic et al., "Design of a SOI Memory Cell", IEEE Proc. 21st International Conference on Microelectronics (MIEL '97), vol. 1, NIS, Yugoslavia, Sep. 14-17, 1997, pp. 297-300.

Su et al., "Studying the Impact of Gate Tunneling on Dynamic Behaviors of Partially-Depleted SOI CMOS Using BSIMPD", IEEE Proceedings of the International Symposium on Quality Electronic Design (ISQED '02), Apr. 2002 (5 pages).

Suma et al., "An SOI-DRAM with Wide Operating Voltage Range by CMOS/SIMOX Technology", 1994 IEEE International Solid-State Circuits Conference, pp. 138-139.

Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.

Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.

Tack et al., "The Multistable Charge-Controlled Memory Effect in SOI MOS Transistors at Low Temperatures", IEEE Transactions on Electron Devices, vol. 37, No. 5, May 1990, pp. 1373-1382.

Tack, et al., "An Analytical Model for the Misis Structure in SOI MOS Devices", Solid-State Electronics vol. 33, No. 3, 1990, pp. 357-364.

Tanabe et al., A 30-ns 64-MB DRAM with Built-in-Self-Test and Self-Repair Function, IEEE Journal of Solid State Circuits, vol. 27, No. 11, Nov. 1992, pp. 1525-1533.

Tanaka et al., "Scalability Study on a Capacitorless 1T-DRAM: From Single-gate PD-SOI to Double-gate FINDRAM", 2004 IEEE, 4 pages.

Tang, Poren, Highly Scalable Capacitorless DRAM Cell on Thin-Body with Band-gap Engineered Source and Drain, Extended Abstracts of the 2009 ICSSDM, Sendai, 2009, pp. 144-145.

Terauchi et al., "Analysis of Floating-Body-Induced Leakage Current in 0.15μm SOI DRAM", Proceedings 1996 IEEE International SOI Conference, Oct. 1996, pp. 138-139.

Thomas et al., "An SOI 4 Transistors Self-Refresh Ultra-Low-Voltage Memory Cell", IEEE, Mar. 2003, pp. 401-404.

Tomishima, et al., "A Long Data Retention SOI DRAM with the Body Refresh Function", IEICE Trans. Electron., vol. E80-C, No. 7, Jul. 1997, pp. 899-904.

Tsaur et al., "Fully Isolated Lateral Bipolar-MOS Transistors Fabricated in Zone-Melting-Recrystallized Si Films on SiO2", IEEE Electron Device Letters, vol. EDL-4, No. 8, Aug. 1983, pp. 269-271.

Tu, et al., "Simulation of Floating Body Effect in SOI Circuits Using BSIM3SOI", Proceedings of Technical Papers (IEEE Cat No. 97TH8303), Jun. 1997, pp. 339-342.

Villaret et al., "Mechanisms of Charge Modulation in the Floating Body of Triple-Well nMOSFET Capacitor-less DRAMs", Proceedings of the INFOS 2003, Insulating Films on Semiconductors, 13th Bi-annual Conference, Jun. 18-20, 2003, Barcelona (Spain), (4 pages).

Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).

Villaret et al., Further Insight into the Physics and Modeling of Floating Body Capacitorless DRAMs, 2005, IEEE Trans. on El. Dev.

Wang et al., A Novel 4.5F2 Capacitorless Semiconductor Memory Device, 2008, IEEE EDL.

Wann et al., "A Capacitorless DRAM Cell on SOI Substrate", IEEE IEDM, 1993, pp. 635-638.

Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.

Wei, A., "Measurement of Transient Effects in SOI DRAM/SRAM Access Transistors", IEEE Electron Device Letters, vol. 17, No. 5, May 1996, pp. 193-195.

Wouters, et al., "Characterization of Front and Back Si-SiO2 Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.

Wu, Dake, "Performance Improvement of the Capacitorless DRAM Cell with Quasi-SOI Structure Based on Bulk Substrate," Extended Abstracts of the 2009 ICSSDM, Sendai, 2009, pp. 146-147.

Yamanaka et al., "Advanced TFT SRAM Cell Technology Using a Phase-Shift Lithography", IEEE Transactions on Electron Devices, vol. 42, No. 7, Jul. 1995, pp. 1305-1313.

Yamauchi et al., "High-Performance Embedded SOI DRAM Architecture for the Low-Power Supply", IEEE Journal of Solid-State Circuits, vol. 35, No. 8, Aug. 2000, pp. 1169-1178.

Yamawaki, M., "Embedded DRAM Process Technology", Proceedings of the Symposium on Semiconductors and Integrated Circuits Technology, 1998, vol. 55, pp. 38-43.

Yang, Optimization of Nanoscale Thyristors on SOI for High-Performance High-Density Memories, 2006, SOI Conference.

Yoshida et al., "A Design of a Capacitorless 1-T-DRAM Cell Using Gate-induced Drain Leakage (GIDL) Current for Low-Power and High-speed Embedded Memory", 2003 IEEE, 4 pages.

Yoshida et al., "A Study of High Scalable DG-FinDRAM", IEEE Electron Device Letters, vol. 26, No. 9, Sep. 2005, pp. 655-657.

Yoshida et al., A Capacitorless 1T-DRAM Technology Using GIDL Current for Low Power and High Speed Embedded Memory, 2006, IEEE Trans. on El. Dev.

Yu et al., Hot-Carrier Effect in Ultra-Thin-Film (UTF) Fully-Depleted SOI MOSFET's, 54th Annual Device Research Conference Digest (Cat. No. 96TH8193), Jun. 1996, pp. 22-23.

Yu et al., "Hot-Carrier-Induced Degradation in Ultra-Thin-Film Fully-Depleted SOI MOSFETs", Solid-State Electronics, vol. 39, No. 12, 1996, pp. 1791-1794.

Yu et al., "Interface Characterization of Fully-Depleted SOI MOSFET by a Subthreshold I-V Method", Proceedings 1994 IEEE International SOI Conference, Oct. 1994, pp. 63-64.

Yun et al., Analysis of Sensing Margin in SOONO Device for the Capacitor-less RAM Applications, 2007, SOI Conference.

Zhou, Physical Insights on BJT-Based 1T Dram Cells, IEEE Electron Device Letters, vol. 30, No. 5, May 2009.

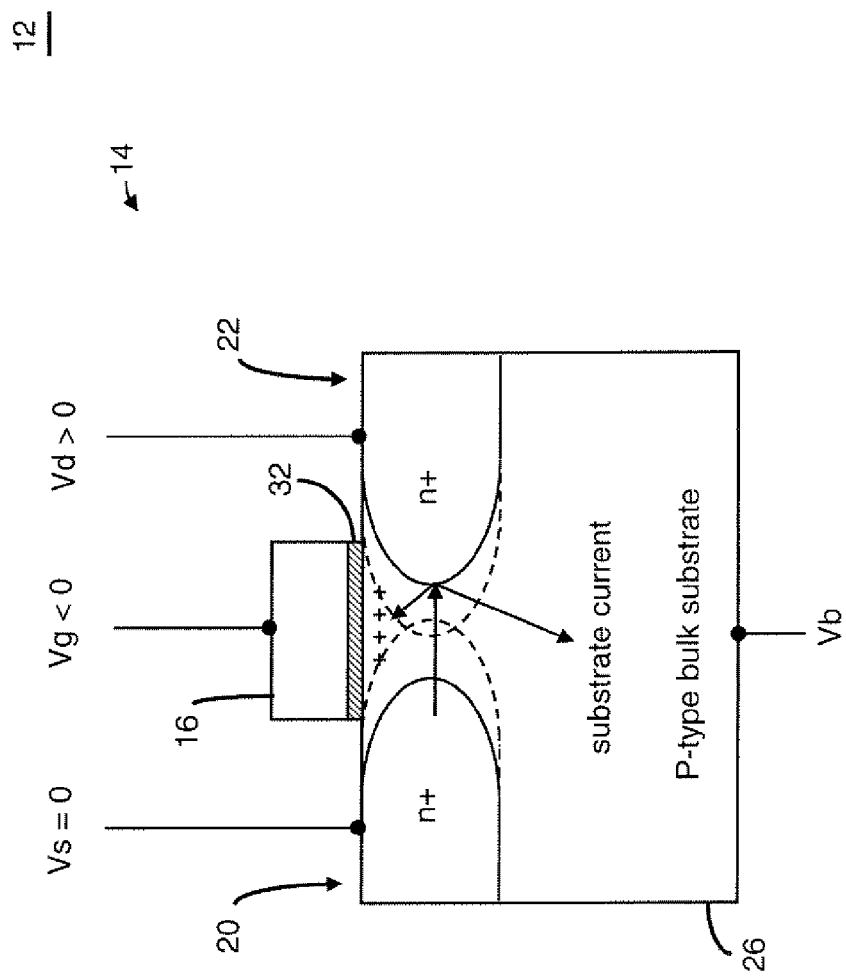

SEMICONDUCTOR MEMORY CELL AND ARRAY USING PUNCH-THROUGH TO PROGRAM AND READ SAME

RELATED APPLICATION

This application is a continuation of U.S. patent application Ser. No. 11/796,935, filed on Apr. 30, 2007, which claims priority to U.S. Provisional Application Ser. No. 60/796,671, entitled "Semiconductor Memory Cell and Array using Punch-Through to Program and Read Same", filed May 2, 2006; the contents of which are incorporated by reference herein in their entireties.

BACKGROUND

These inventions relates to a semiconductor memory cell, array, architecture and device, and techniques for reading, controlling and/or operating such cell and device; and more particularly, in one aspect, to a semiconductor dynamic random access memory ("DRAM") cell, array, architecture and/or device wherein the memory cell includes an electrically floating body in which an electrical charge is stored.

One type of dynamic random access memory cell is based on, among other things, a floating body effect of semiconductor on insulator ("SOI") transistors. (See, for example, U.S. patent application Ser. No. 10/450,238, Fazan et al., filed Jun. 10, 2003 and entitled "Semiconductor Device", hereinafter "Semiconductor Memory Device Patent Application"). In this regard, the memory cell may consist of a PD or a FD SOI transistor (or transistor formed in bulk material/substrate) having a channel, which is disposed adjacent to the body and separated therefrom by a gate dielectric. The body region of the transistor is electrically floating in view of the insulation or non-conductive region (for example, in bulk-type material/substrate) disposed beneath the body region. The state of memory cell is determined by the concentration of charge in the body region of the transistor.

With reference to FIGS. 1A, 1B and 1C, in one embodiment, semiconductor DRAM array 10 includes a plurality of memory cells 12, each consisting of transistor 14 having gate 16, an electrically floating body region 18, source region 20 and drain region 22. The body region 18 is disposed between source region 20 and drain region 22. Moreover, body region 18 is disposed on or above region 24, which may be an insulation region (for example, in SOI material/substrate) or non-conductive region (for example, in bulk-type material/substrate). The insulation or non-conductive region may be disposed on substrate 26.

Data is written into or read from a selected memory cell by applying suitable control signals to a selected word line(s) 28, a selected source line(s) 30 and/or a selected bit line(s) 32. In response, charge carriers are accumulated in or emitted and/or ejected from electrically floating body region 18 wherein the data states are defined by the amount of carriers within electrically floating body region 18. Notably, the entire contents of the Semiconductor Memory Device Patent Application, including, for example, the features, attributes, architectures, configurations, materials, techniques and advantages described and illustrated therein, are incorporated by reference herein.

Notably, for at least the purposes of this discussion, logic high or State "1" corresponds to an increased concentration of majority carriers in the body region relative to an unprogrammed device and/or a device that is programmed with a logic low or State "0". In contrast, a logic low or State "0" corresponds to a reduced concentration of majority carriers in the body region relative to an unprogrammed device and/or a device that is programmed with logic high or State "1".

SUMMARY OF THE INVENTIONS

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

In a first principle aspect, the present inventions are directed to an integrated circuit device (for example, logic or discrete memory device) comprising a memory cell including at least one transistor, wherein the transistor, in operation, operates in a punch-through. The transistor includes (i) a first region having impurities to provide a first conductivity type and a first junction, (ii) a second region having impurities to provide a first conductivity type and a second junction, wherein when the transistor is in operation, the first and second junctions abut or overlap, (iii) a body region, disposed between the first region and the second region, having impurities to provide a second conductivity type wherein the second conductivity type is different from the first conductivity type. The transistor further includes (i) a gate disposed over the body region and (ii) a gate insulator disposed between the gate and the body region wherein the body region includes a storage node which is located, at least in part, immediately beneath the gate insulator. The memory cell includes at least two data states which are representative of a charge in the body region.

The integrated circuit device further includes first circuitry, coupled to the transistor of the memory cell, to: (1) generate first and second sets of write control signals and (2a) apply the first set of write control signals to the transistor to write a first data state in the memory cell and (2b) apply the second set of write control signals to the transistor to write a second data state in the memory cell. In response to the first set of write control signals, the transistor provides at least a first charge (for example, substantially in the storage node of the body region) which is representative of the first data state in the body region via impact ionization.

In one embodiment, the body region of the transistor is electrically floating. In another embodiment, the transistor is disposed in or on a semiconductor region or layer which resides on or above an insulating region or layer of a substrate wherein the body region is disposed between the first region, the second region, the gate insulator and the insulating region or layer of the substrate. The transistor may be disposed on bulk-type semiconductor substrate or SOI-type substrate.

In one embodiment, the transistor, in response to read control signals applied to the memory cell, generates a punch-through current which is representative of the data state of the memory cell and wherein the data sense circuitry determines the data state of the memory cell at least substantially based on the second bipolar transistor current. The integrated circuit device may further include second circuitry to read the data state of the memory cell wherein second circuitry determines the data state of the memory cell at least substantially based on a punch-through current.

In another principal aspect, the present inventions are directed to an integrated circuit device (for example, logic or discrete memory device) comprising a memory cell including at least one punch-through mode transistor, wherein the punch-through mode transistor includes: (i) a first region, (ii) a second region, (iii) a body region disposed between the first region and the second region, (iv) a gate disposed over the body region and (v) a gate insulator disposed between the gate and the body region wherein the body region includes a storage node which is located, at least in part, immediately beneath the gate insulator. The memory cell includes at least two data states including (i) a first data state which is representative of a first charge in the body region, and (ii) a second data state which is representative of a second charge in the body region.

The integrated circuit device of this aspect may include first circuitry, coupled to the transistor of the memory cell, to: (1) generate first and second sets of write control signals and (2a) apply the first set of write control signals to the transistor to write the first data state in the memory cell and (2b) apply the second set of write control signals to the transistor to write the second data state in the memory cell. The transistor, in response to the first set of write control signals, stores at least the first charge in the body region (for example, substantially in the storage node) wherein the first charge is provided or created via impact ionization and, in response to the second set of write control signals, the transistor stores no more than the second charge in the body region.

In one embodiment, the body region of the transistor is electrically floating. In another embodiment, the transistor is disposed in or on a semiconductor region or layer which resides on or above an insulating region or layer of a substrate wherein the body region is disposed between the first region, the second region, the gate insulator and the insulating region or layer of the substrate. The transistor may be disposed on bulk-type semiconductor substrate or SOI-type substrate.

In one embodiment, the transistor, in response to read control signals applied to the memory cell, generates a punch-through current which is representative of the data state of the memory cell and wherein the data sense circuitry determines the data state of the memory cell at least substantially based on the second bipolar transistor current. The integrated circuit device may further include second circuitry to read the data state of the memory cell wherein second circuitry determines the data state of the memory cell at least substantially based on a punch-through current.

Notably, the second charge may be provided in the body region by causing majority carriers out of the body region via the first and/or second regions.

In another principal aspect, the present inventions are directed to an integrated circuit device (for example, logic or discrete memory device) comprising a memory cell including at least one punch-through mode transistor, wherein the punch-through mode transistor includes: (i) a first region, (ii) a second region, (iii) a body region disposed between the first region and the second region, (iv) a gate disposed over the body region and (v) a gate insulator disposed between the gate and the body region wherein the body region includes a storage node which is located, at least in part, immediately beneath the gate insulator. The memory cell includes at least two data states which are representative of an amount of charge in the body region.

The integrated circuit device of this aspect further includes first circuitry, coupled to the punch-through mode transistor of the memory cell, to: (1) generate first and second sets of write control signals and (2a) apply the first set of write control signals to the punch-through mode transistor to write a first data state in the memory cell and (2b) apply the second set of write control signals to the punch-through mode transistor to write a second data state in the memory cell. In response to the first set of write control signals, the punch-through mode transistor stores a charge in the body region (for example, substantially in the storage node of the body region) which is provided or created via impact ionization.

In one embodiment, the body region of the transistor is electrically floating. In another embodiment, the transistor is disposed in or on a semiconductor region or layer which resides on or above an insulating region or layer of a substrate wherein the body region is disposed between the first region, the second region, the gate insulator and the insulating region or layer of the substrate. The transistor may be disposed on bulk-type semiconductor substrate or SOI-type substrate.

In one embodiment, the transistor, in response to read control signals applied to the memory cell, generates a punch-through current which is representative of the data state of the memory cell and wherein the data sense circuitry determines the data state of the memory cell at least substantially based on the second bipolar transistor current. The integrated circuit device may further include second circuitry to read the data state of the memory cell wherein second circuitry determines the data state of the memory cell at least substantially based on a punch-through current.

In another principal aspect, the present inventions are directed to an integrated circuit device (for example, logic or discrete memory device) comprising a memory cell including at least one transistor, wherein the transistor, in operation, operates in a punch-through. The transistor includes: (i) a first region having impurities to provide a first conductivity type and a first junction, (ii) a second region having impurities to provide a first conductivity type and a second junction, wherein when the transistor is in operation, the first and second junctions abut or overlap, (iii) a body region, disposed between the first region and the second region, having impurities to provide a second conductivity type wherein the second conductivity type is different from the first conductivity type, (iv) a gate disposed over the body region, and (v) a gate insulator disposed between the gate and the body region wherein the body region includes a storage node which is located, at least in part, immediately beneath the gate insulator. The memory cell includes at least two data states which are representative of an amount of charge in the storage node in the body region.

The integrated circuit device of this aspect of the present inventions further includes first circuitry, coupled to the transistor of the memory cell, to: (1) generate first and second sets of write control signals and (2a) apply the first set of write control signals to the transistor to write a first data state in the memory cell and (2b) apply the second set of write control signals to the transistor to write a second data state in the memory cell. In response to the first set of write control signals, the transistor stores a charge in the body region (for example, substantially in the storage node of the body region) which is provided or created via impact ionization.

In one embodiment, the body region of the transistor is electrically floating. In another embodiment, the transistor is disposed in or on a semiconductor region or layer which resides on or above an insulating region or layer of a substrate wherein the body region is disposed between the first region, the second region, the gate insulator and the insulating region or layer of the substrate. The transistor may be disposed on bulk-type semiconductor substrate or SOI-type substrate.

In one embodiment, the transistor, in response to read control signals applied to the memory cell, generates a punch-through current which is representative of the data state of the memory cell and wherein the data sense circuitry determines the data state of the memory cell at least substantially based on the second bipolar transistor current. The integrated circuit device may further include second circuitry to read the data state of the memory cell wherein second circuitry determines the data state of the memory cell at least substantially based on a punch-through current.

Again, there are many inventions, and aspects of the inventions, described and illustrated herein. This Summary of the Inventions is not exhaustive of the scope of the present inventions. Moreover, this Summary of the Inventions is not intended to be limiting of the inventions or the claims (whether the currently presented claims or claims of a divisional/continuation application) and should not be interpreted in that manner. While certain embodiments have been described and/or outlined in this Summary of the Inventions, it should be understood that the present inventions are not limited to such embodiments, description and/or outline, nor are the claims limited in such a manner (which should also not be interpreted as being limited by the Summary of the Inventions).

Indeed, many other aspects, inventions and embodiments, which may be different from and/or similar to, the aspects, inventions and embodiments presented in this Summary, will be apparent from the description, illustrations and claims, which follow. In addition, although various features, attributes and advantages have been described in this Summary of the Inventions and/or are apparent in light thereof, it should be understood that such features, attributes and advantages are not required whether in one, some or all of the embodiments of the present inventions and, indeed, need not be present in any of the embodiments of the present inventions.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

FIGS. 3A and 3B are exemplary cross-sectional illustrations of a memory cell according to the present inventions, in conjunction with exemplary control voltages applied to various regions or portions of the memory cell to program the memory cell to logic state "1" (i.e., generate or provide an excess of majority carrier in the electrically floating body of the memory cell of FIGS. 2A and 2B); notably, majority carriers in these exemplary embodiments are generated or provided (or substantially generated or provided) via punch-through electron impact ionization;

DETAILED DESCRIPTION

In one aspect, the present inventions are directed to techniques for reading, controlling and/or operating a semiconductor memory cell, array, and device having memory cells including at least one electrically floating body transistor in which electrical charge is stored in the body of the transistor. The present inventions are also directed to semiconductor memory cell, array, architecture and device that include circuitry to implement such reading, controlling and/or operating techniques. The memory cell array may comprise a portion of an integrated circuit device, for example, a logic device (such as, a microcontroller or microprocessor) or a memory device (such as, a discrete memory device) having a plurality of memory cells. The inventive programming techniques may be implemented with or without employing a back gate or substrate terminals for SOI and bulk semiconductor technologies.

Further, the present inventions, in one aspect, describe a new memory cell and a combination of the programming/reading methods. The memory cell may be implemented in a memory array which is disposed in/on a logic or discrete memory device. Such logic or discrete memory device may be smaller and consume less power in view of memory cells array implementing conventional architectures and techniques. Notably, the present inventions may be implemented on or in an SOI technology or a bulk semiconductor technology and may provide a memory cell comprising an electrically floating body transistor that is less sensitive to technology variations having improvement in retention characteristics relative to conventional architectures and techniques.

Figure 1A:
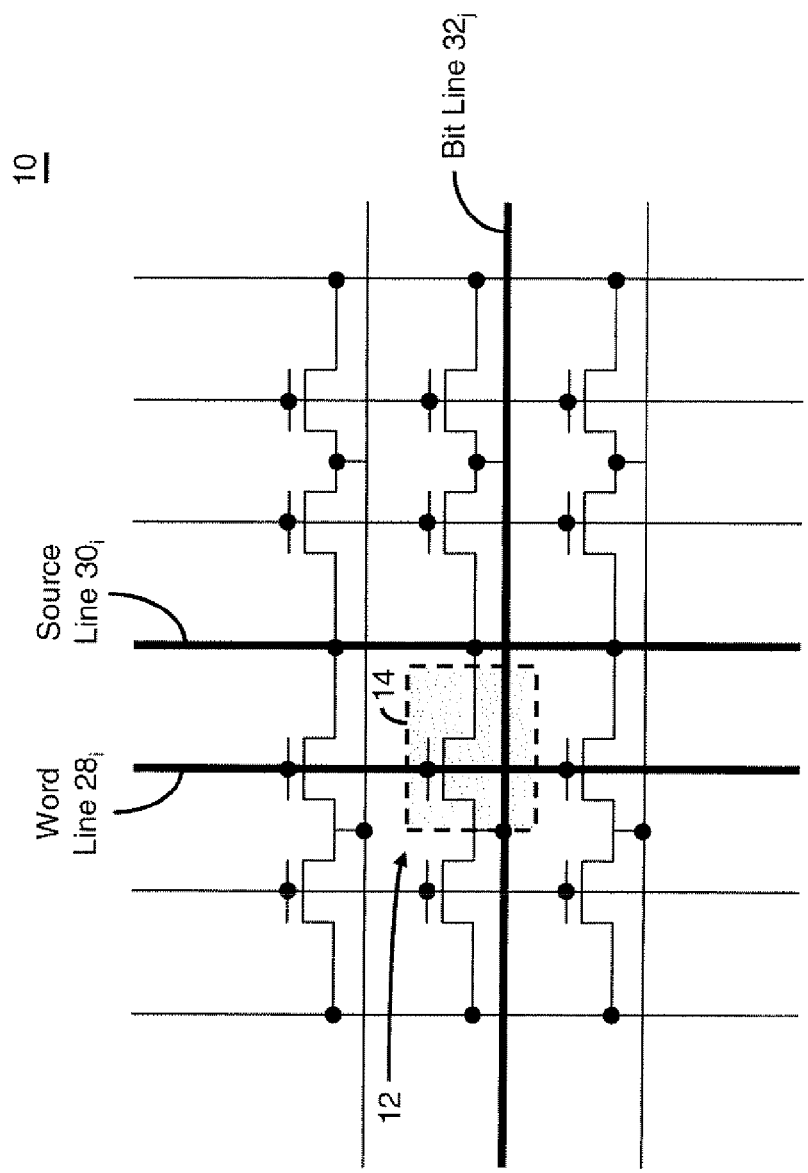
FIG. 1A is a schematic representation of a prior art DRAM array including a plurality of memory cells, each having one electrically floating body transistor.
Figure 1B:
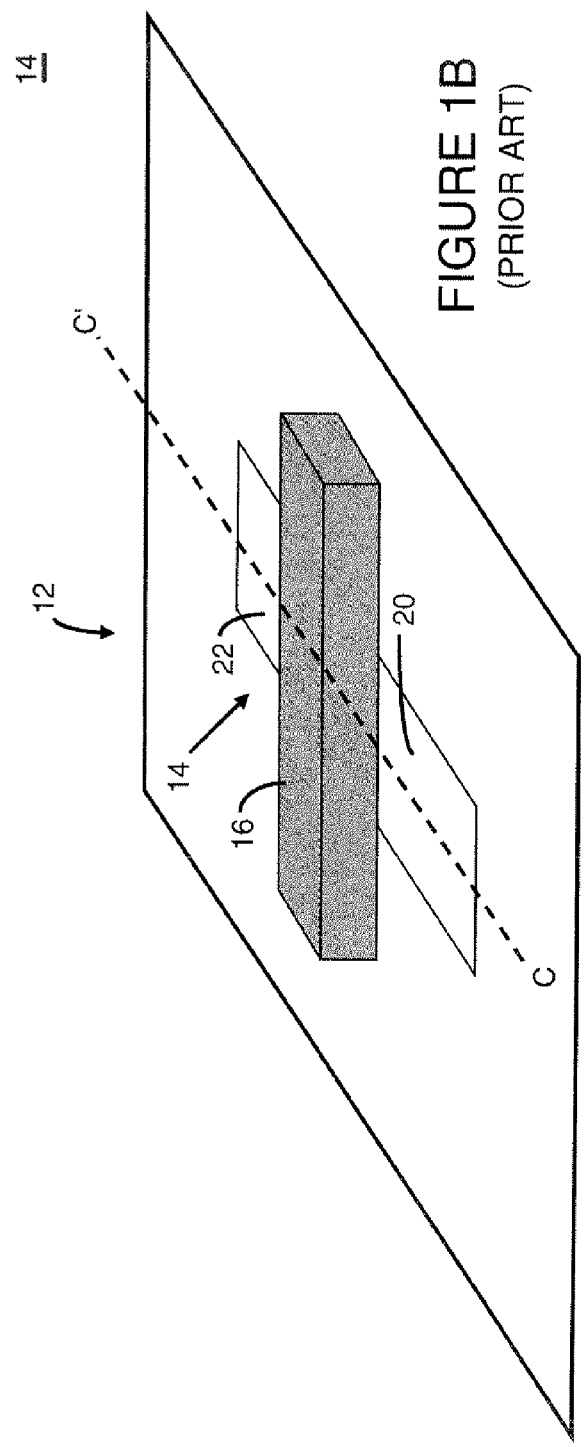
FIG. 1B is a three-dimensional view of an exemplary prior art memory cell comprised of one electrically floating body partially depleted transistor (PD-SOI NMOS)
Figure 1C:
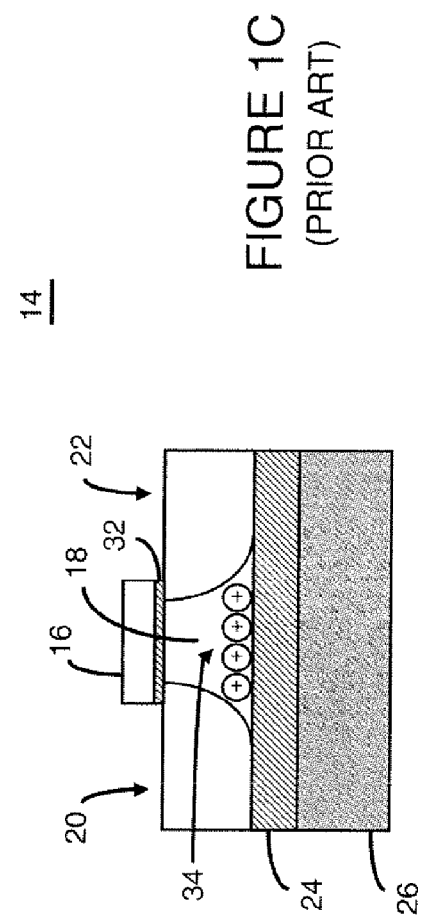
FIG. 1C is a cross-sectional view of the prior art memory cell of FIG. 1B, cross-sectioned along line C-C'.
Figure 2A:
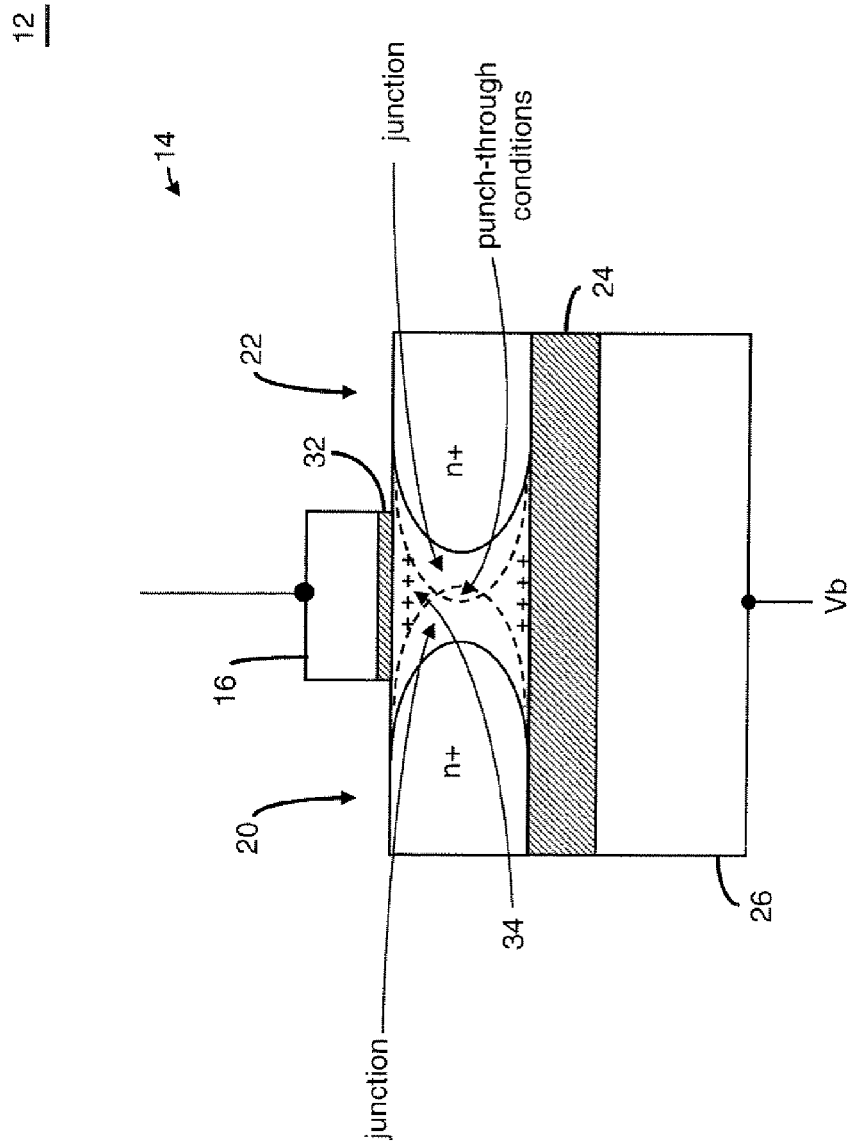
FIGS. 2A and 2B are exemplary cross-sectional illustrations of a memory cell using SOI and bulk semiconductor technologies, respectively, according to exemplary embodiments of the present inventions.
Figure 2B:
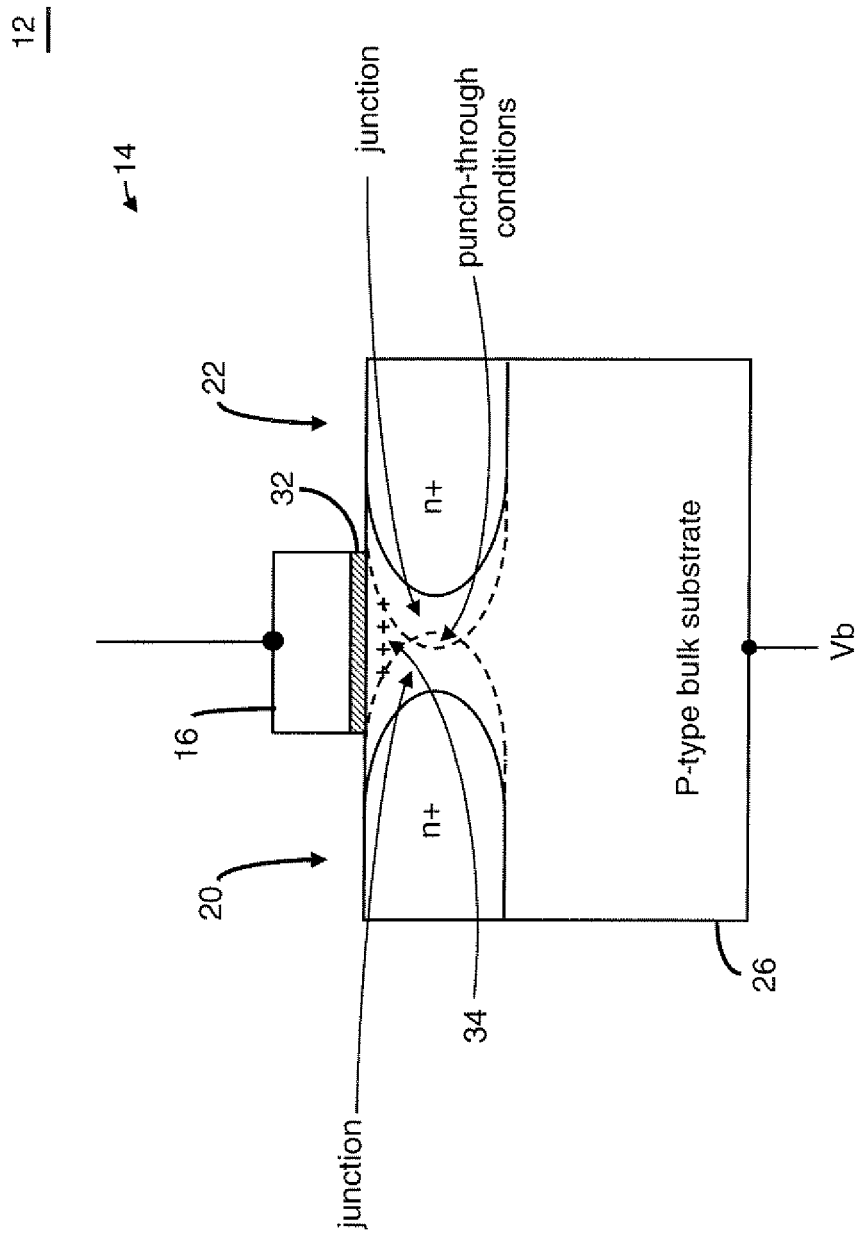

With reference to FIGS. 2A and 2B, in a first set of embodiments, the present inventions employ memory cell 12 including transistor 14, having a body region, which is disposed on or in an SOI technology (FIG. 2A) or a bulk semiconductor technology (FIG. 2B). The transistor 14 is configured, controlled and/or designed to operate in a punch-through mode. In this embodiment, the junctions (or the depletion regions) between (i) source region 20 and body region 18 and (ii) drain region 22 and body region 18 abut or overlap.

In the illustrated exemplary embodiments, the "punch-through" transistor 14 is depicted as an N-channel type device. As such, majority carriers 34 are "holes". The "punch-through" transistor may also be a P-channel type device. Under these circumstances, the majority carriers are electrons.

The portion of the body region which is located immediately under gate 16 and/or gate oxide 32 forms at least a portion (for example, a substantial portion) of the storage node of memory cell 12. In this regard, the portion of the body region which is located immediately under gate 16 and/or gate oxide 32 is (sufficiently) electrically isolated from other portions of the body region of transistor 14 by the punch-through configuration.

Figure 3A:
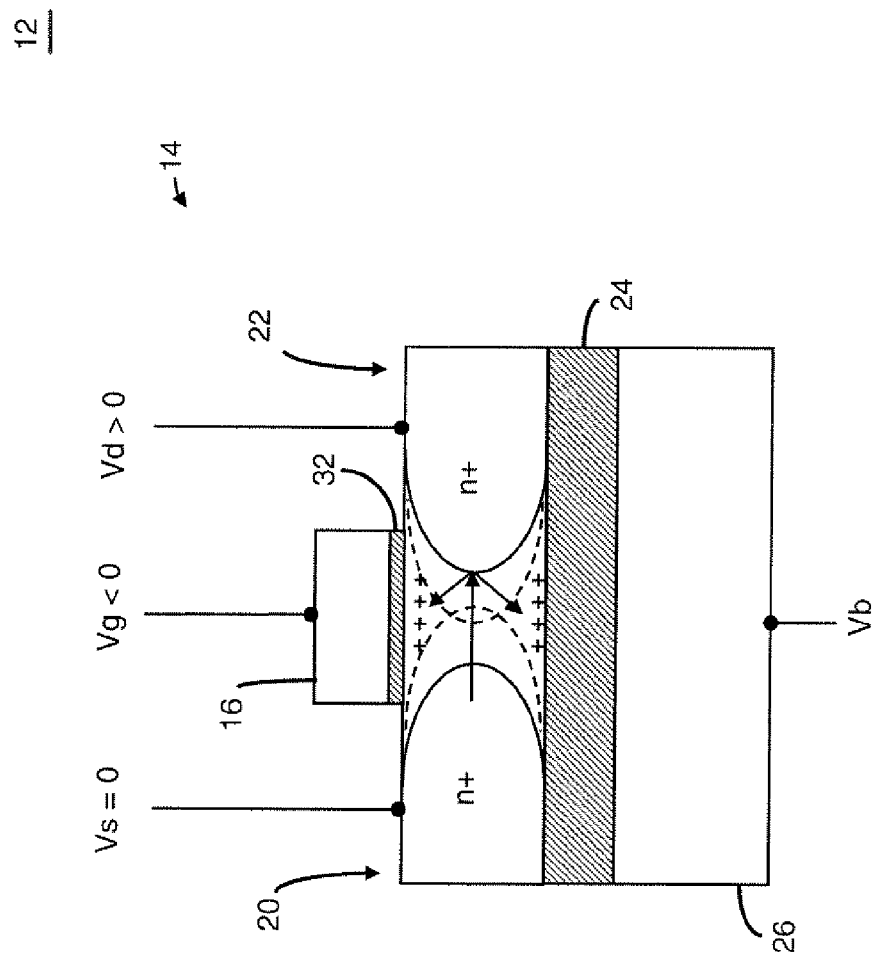

Notably, with reference to FIG. 3A, in case of an SOI technology, a portion of the charge may be stored in the area close to the interface of insulation region 24 (for example, a buried silicon dioxide or other insulator). Moreover, with reference to FIG. 2B, the portion of the body region which is located immediately under gate 16 and/or gate oxide 32 is (sufficiently) electrically isolated from other portions of the body region of transistor 14 as well as portions of the substrate which are beneath the source, drain and body regions. The punch-through transistor may be "optimized" and/or enhanced for the type of memory cell by adjusting the gate length, body doping and source/drain junctions.

In operation, when writing or programming a logic "1" or logic high, in one exemplary embodiment, control signals (having exemplary voltages of: Vg=−1.2V, Vd=+2V and Vs=0V) are applied to gate 16, source region 20 and drain region 22 (respectively) of transistor 14 of memory cell 12 which, in combination, induce, cause, provide and/or result in impact ionization via the punch-through current (see, FIGS. 3A and 3B). In another embodiment, when writing or programming a logic "1" or logic high, control signals (having exemplary voltages of: Vg=−2.5V, Vd=+2.5V and Vs=0V) are applied to gate 16, source region 20 and drain region 22 (respectively) of transistor 14 of memory cell 12 which, in combination, induce, cause, provide and/or result in generation of majority carriers by the GIDL (band-to-band tunneling). The generated majority carriers are, at least in part, stored in a portion of the body region that is located immediately under gate 16 and/or gate oxide 32 (FIGS. 3A and 3B). As noted above, in case of an SOI technology, a portion of the charge may be stored in the area close to the interface of insulation region 24 (for example, a buried silicon dioxide or other insulator) (see, FIG. 3A).

Where the memory cell of the present inventions is implemented in a memory array, it may be advantageous to implement a "holding" operation when programming one or more of the memory cells of the array to enhance the retention characteristics of the memory cell. The transistor 14 of memory cell 12 may be placed in a "holding" state via application of control signals that are applied to gate 16 and source region 20 and drain region 22 of transistor 14 of memory cell 12. In combination, such control signals provide, cause and/or induce majority carrier accumulation in an area that is located immediately under gate 16 and/or gate oxide 32. In this embodiment, it may be preferable to apply a negative voltage to gate 16 where transistor 14 is an N-channel device. Holding voltages may be optimized to obtain a suitable, enhanced and/or maximum retention time. For example, in one exemplary embodiment, control voltages to establish the "holding" state include: Vg=−1.2V, Vs=Vd=0V.

Figure 4A:
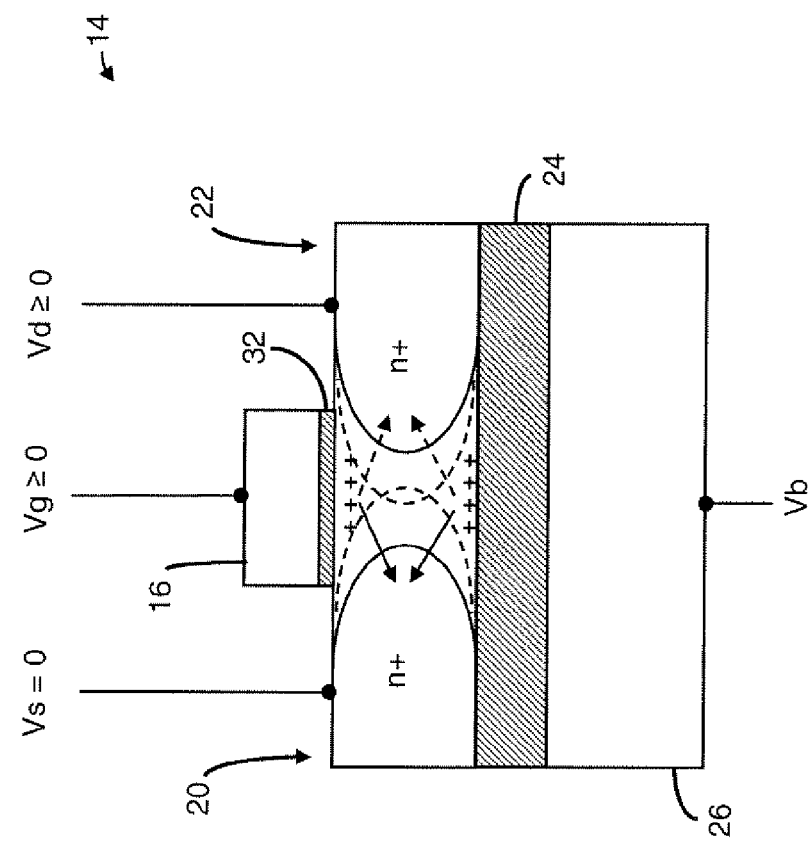
FIGS. 4A and 4B are exemplary cross-sectional illustrations of a memory cell according to the present inventions, in conjunction with exemplary control voltages applied to various regions or portions of the memory cell to program the memory cell to logic state "0" (i.e., provide relatively fewer majority carrier by removing from the electrically floating body region of the transistor of the memory cell of FIGS. 2A and 2B); notably, majority carriers may be removed through the drain region/terminal and/or the source region/terminal, and/or through both drain and source regions/terminals and/or punch-through area via application of control signals applied to the various regions or portions of the memory cell, for example, via application of a gate voltage/bias (i.e., voltage applied to the gate), which is higher than the holding gate voltage/bias, and a drain voltage/bias, which is lower than the voltage applied to the drain when writing logic state "1" (i.e., the drain voltage/bias for logic state "1")
Figure 4B:
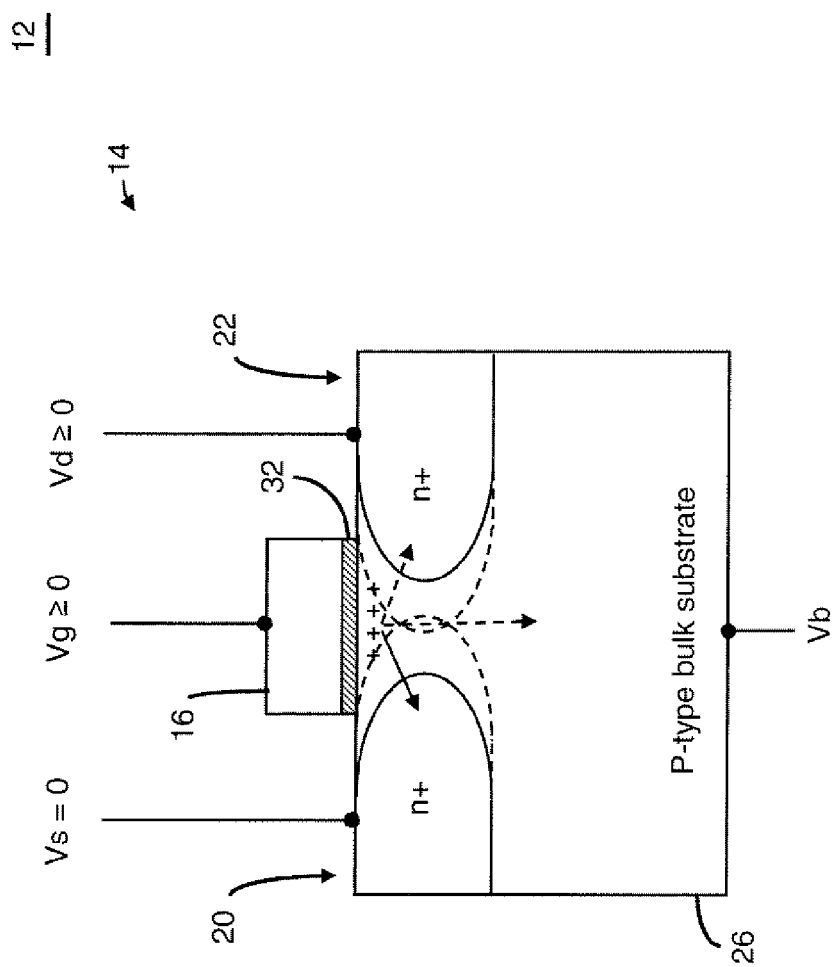

Further, when writing or programming a logic "0" in transistor 14 of memory cell 12, in one exemplary embodiment, the control signals (having exemplary voltages of: Vg=0.5v, Vd=2v and Vs=0v) may be applied to gate 16, source 18 and drain 20 of transistor 14 such that, in at least one embodiment, the voltage applied to gate 16 of transistor 14 of memory cell 12 is higher than a holding voltage (if applicable)). In response, majority carriers are removed from the body region of transistor 14. For example, in one embodiment, the majority carriers may be removed, eliminated and/or ejected from the body region of transistor 14 through (i) source region 20, (ii) drain region, or (iii) source region 20 and drain region 22. In another example, the majority carriers may be removed, eliminated and/or ejected from the body region via punch-through. (See, FIGS. 4A and 4B).

Figure 5A:
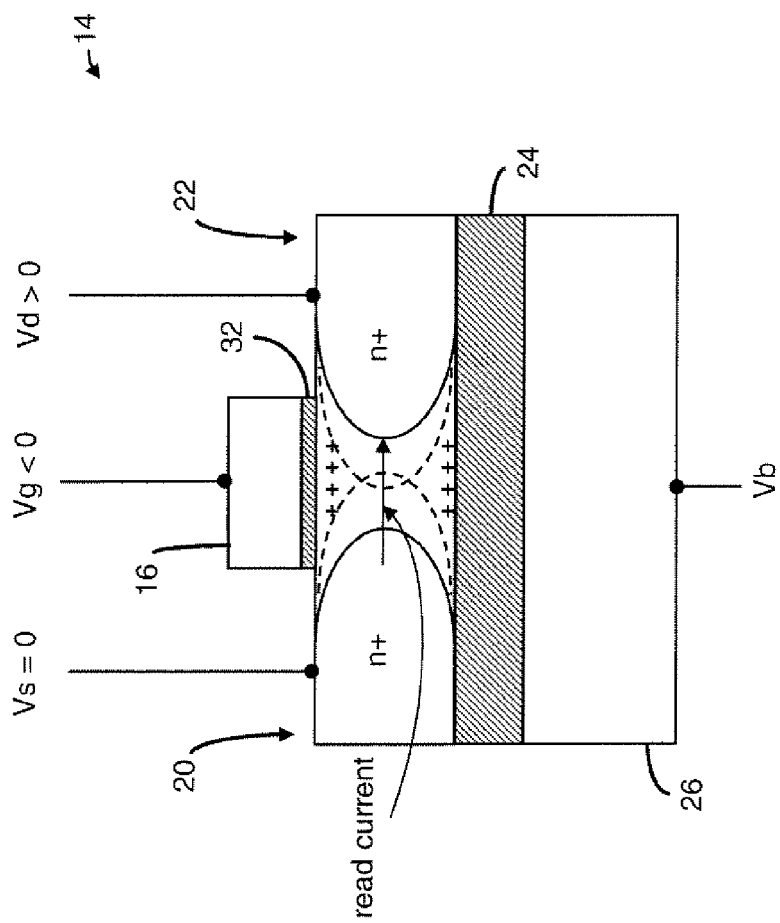
FIGS. 5A and 5B are exemplary cross-sectional illustrations of a memory cell according to the present inventions, in conjunction with exemplary control voltages applied to various regions or portions of the memory cell to read the stored data state (i.e., sense the data state stored in the memory cell—that is, the charge carrier concentration in the electrically floating body region of the transistor which is representative of a predetermined data state of the memory cell of FIGS. 2A and 2B); notably, in an exemplary embodiment, the data state of the memory cell may be determined by sensing or sampling the amount of the punch-through current provided/generated (or substantially provided/generated) in response to the application of a predetermined voltages on the gate and drain of the transistor of the memory cell using, for example, a sense amplifier.
Figure 5B:
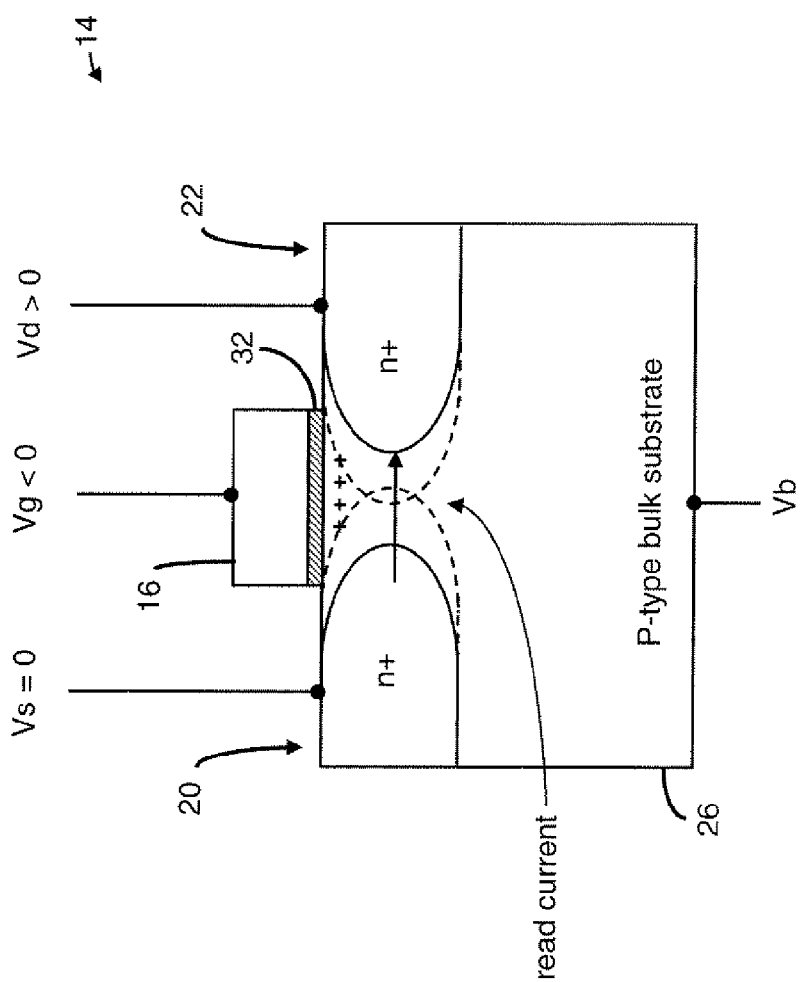

With reference to FIGS. 5A and 5B, in another set of embodiments, the data state of memory cell 12 may be sensed, sampled, read and/or determined by applying control signals (having exemplary voltages of: Vg=−0.8v, Vd=0.5v and Vs=0v) to gate 16 and source region 20 and drain region 22 of transistor 14. Such signals, in combination, induce and/or cause a punch-through current. The amount of the punch-through current is, at least in part, determined or defined by the amount of charge stored in transistor 14. As such, the data state of memory cell 12 may be determined by sensing, sampling, reading and/or determining the punch-through current using data sense circuitry, for example, sense amplifier circuitry (such as a cross-coupled sense amplifier).

With reference to FIGS. 6A, 6B, 7 and 9, in exemplary embodiments, control signals having a predetermined amplitude may be selectively applied to a row of memory cells (for example, memory cells 12a-d, which are coupled to word lines $28_i$) to write logic state "1" into selected memory cells 12a and 12d, and logic state "0" into selected memory cells 12b and 12c. In particular, in this exemplary embodiment, a logic state "1" may be programmed or written in memory cells 12a and 12d by applying a voltage pulse of +2V to source region 20 of the transistors of memory cells 12a and 12d and a voltage pulse of +0.5V to gate 16 of the transistors of memory cells 12a and 12d. The source pulse may be applied before the gate pulse, simultaneously thereto, or after the gate pulse is applied to gate 16 of the transistors of memory cells 12a and 12d. It is preferred that the source pulse be applied to source region 20 of the transistors of memory cells 12a and 12d with a sufficient amplitude to maintain a sufficient punch-through current to program a logic state "1" into memory cells 12a and 12d. From a relative timing perspective, it is preferred that the source pulse extends beyond when the gate pulse reduces or ceases. (See, for example, FIGS. 6A and 6B).

With continued reference to FIGS. 6A, 6B, 7 and 9, in these exemplary embodiments, control signals having predetermined amplitudes may be applied to the transistors of memory cells 12b and 12c to write or program logic state "0" therein. The source pulse may be applied to source region 20 of the transistors of memory cells 12b and 12c before the gate pulse is applied to gate 16 of the transistors of memory cells 12b and 12c, or simultaneously thereto, or after the gate pulse is applied to gate 16 of the transistors of memory cells 12b and 12c. Further, as illustrated, a drain pulse (0.5V amplitude in this example) is applied to drain regions 22 of the transistors of memory cells 12b and 12d to prevent, prohibit, limit and/or retard a punch-through current from causing or generating a sufficient charge in the floating body region of memory cells 12b and 12c to program or write a logic state "1" into memory cells 12b and 12c. The drain pulse may be characterized as a "blocking" pulse.

Figure 6A:
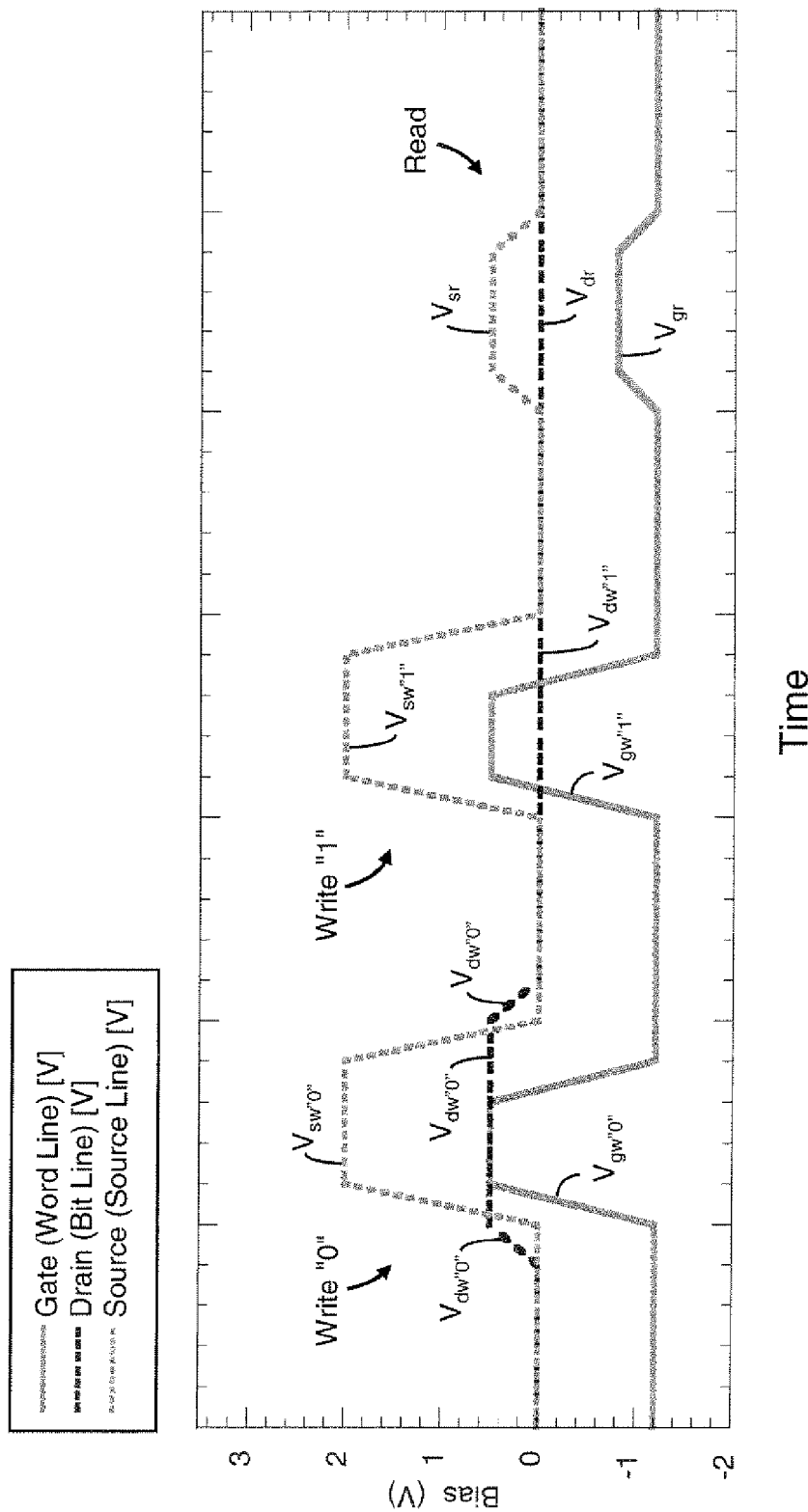
FIG. 6A illustrates exemplary timing relationships and control signal waveform of (i) selected write control signals for programming or writing a logic state "0" into one or more N-channel type memory cells, (ii) programming or writing logic state "1" into one or more N-channel type memory cells, and (iii) reading one or more N-channel type memory cells, according to an exemplary embodiment of the present inventions.
Figure 6B:
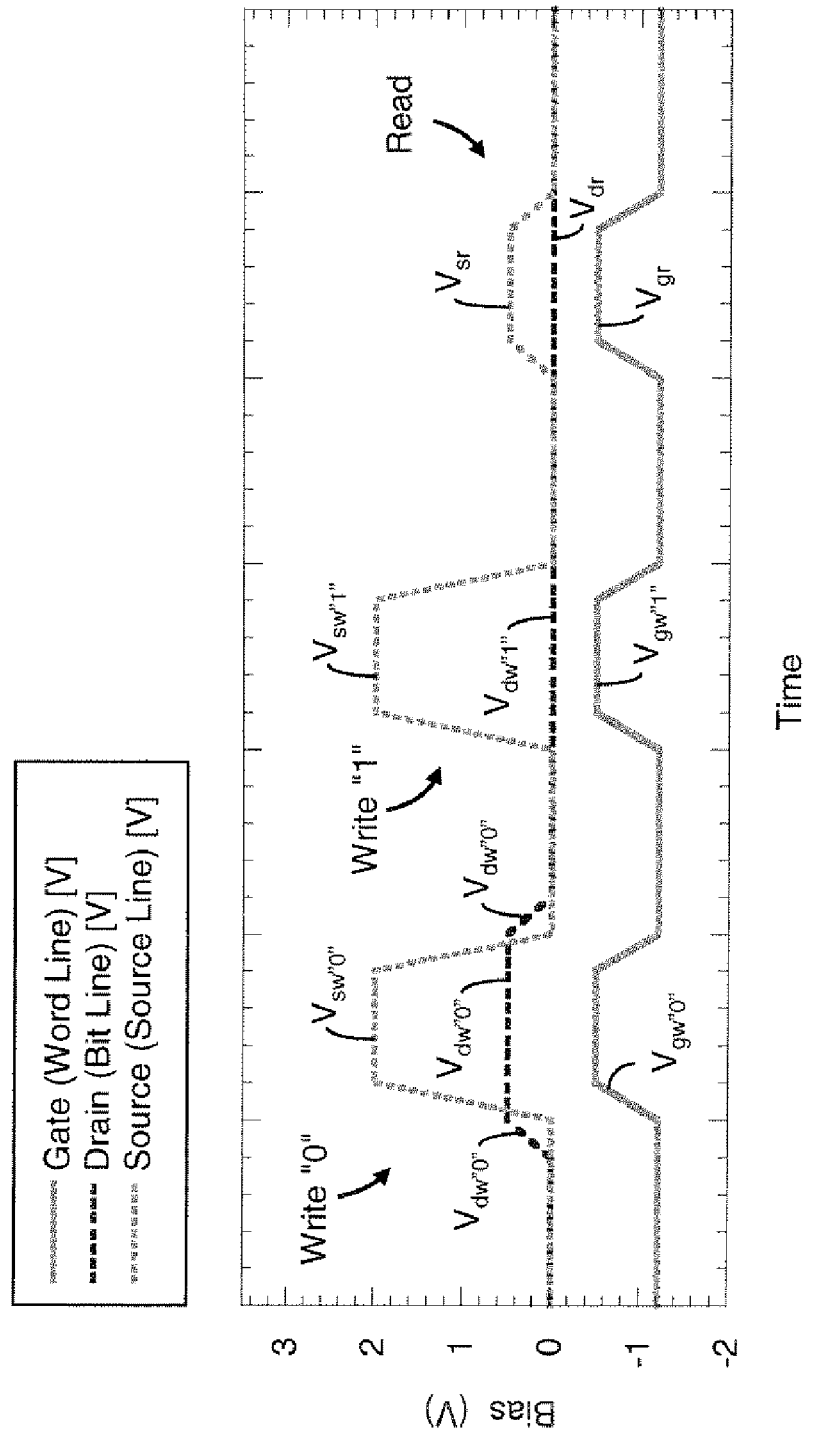
FIG. 6B illustrates exemplary timing relationships and control signal waveform of (i) selected write control signals for programming or writing a logic state "0" into one or more N-channel type memory cells, (ii) programming or writing logic state "1" into one or more N-channel type memory cells, and (iii) reading one or more N-channel type memory cells, according to an exemplary embodiment of the present inventions.
Figure 7:
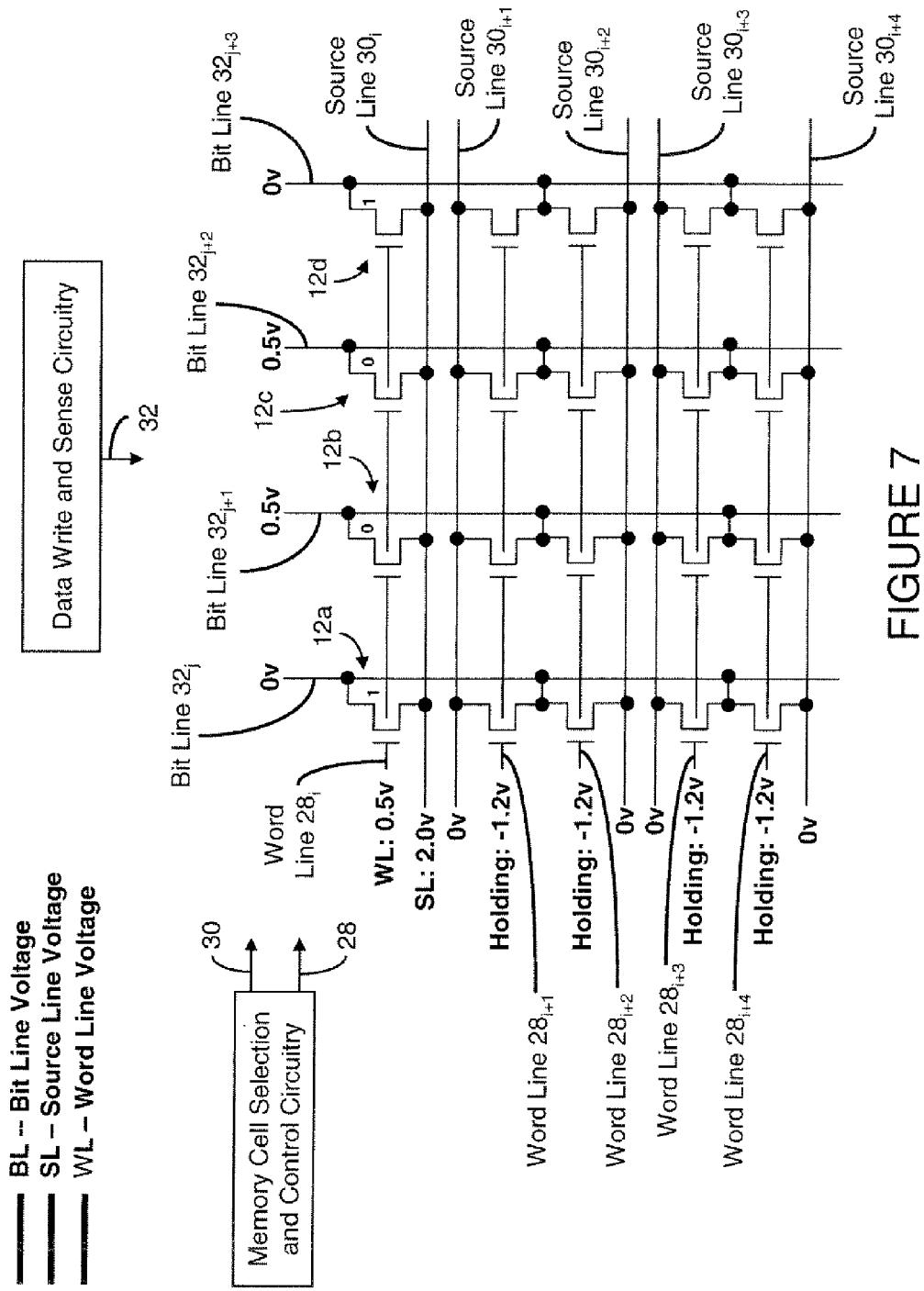
FIGS. 7 and 8 illustrate exemplary embodiments of a memory array having a plurality of memory cells and employing a separated source line configuration for each row of memory cells, in conjunction with exemplary programming techniques, including exemplary control signal voltage values (FIG. 7) and exemplary reading techniques, including exemplary control signal voltage values (FIG. 8), according to certain aspects of the present inventions.
Figure 8:
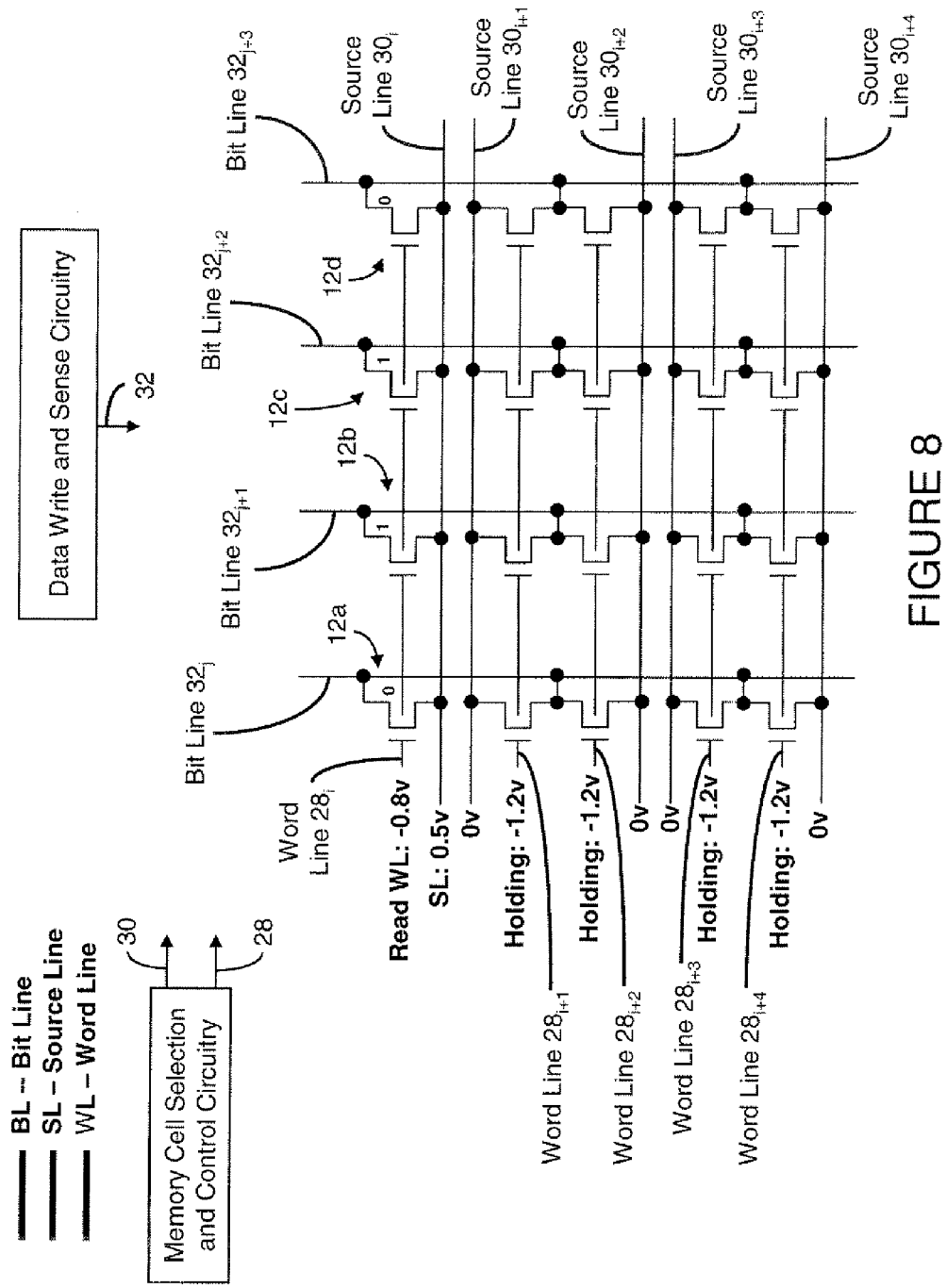
Figure 9:
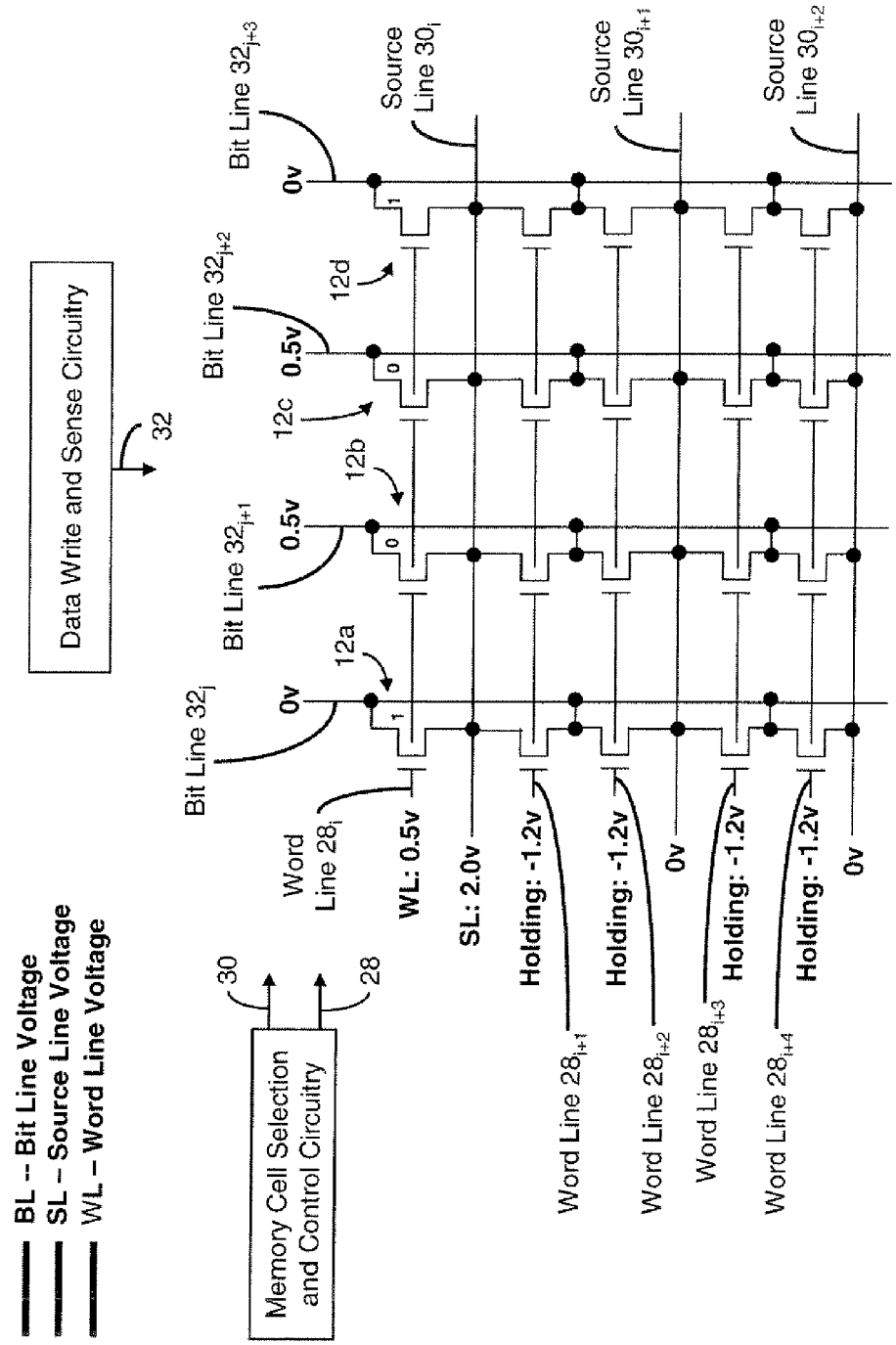
FIGS. 9 and 10 illustrate exemplary embodiments of a memory array having a plurality of memory cells and employing a common source line configuration for each row of memory cells in conjunction with exemplary programming techniques, including exemplary control signal voltage values (FIG. 9), and exemplary reading techniques, including exemplary control signal voltage values (FIG. 10), according to certain aspects of the present inventions.
Figure 10:
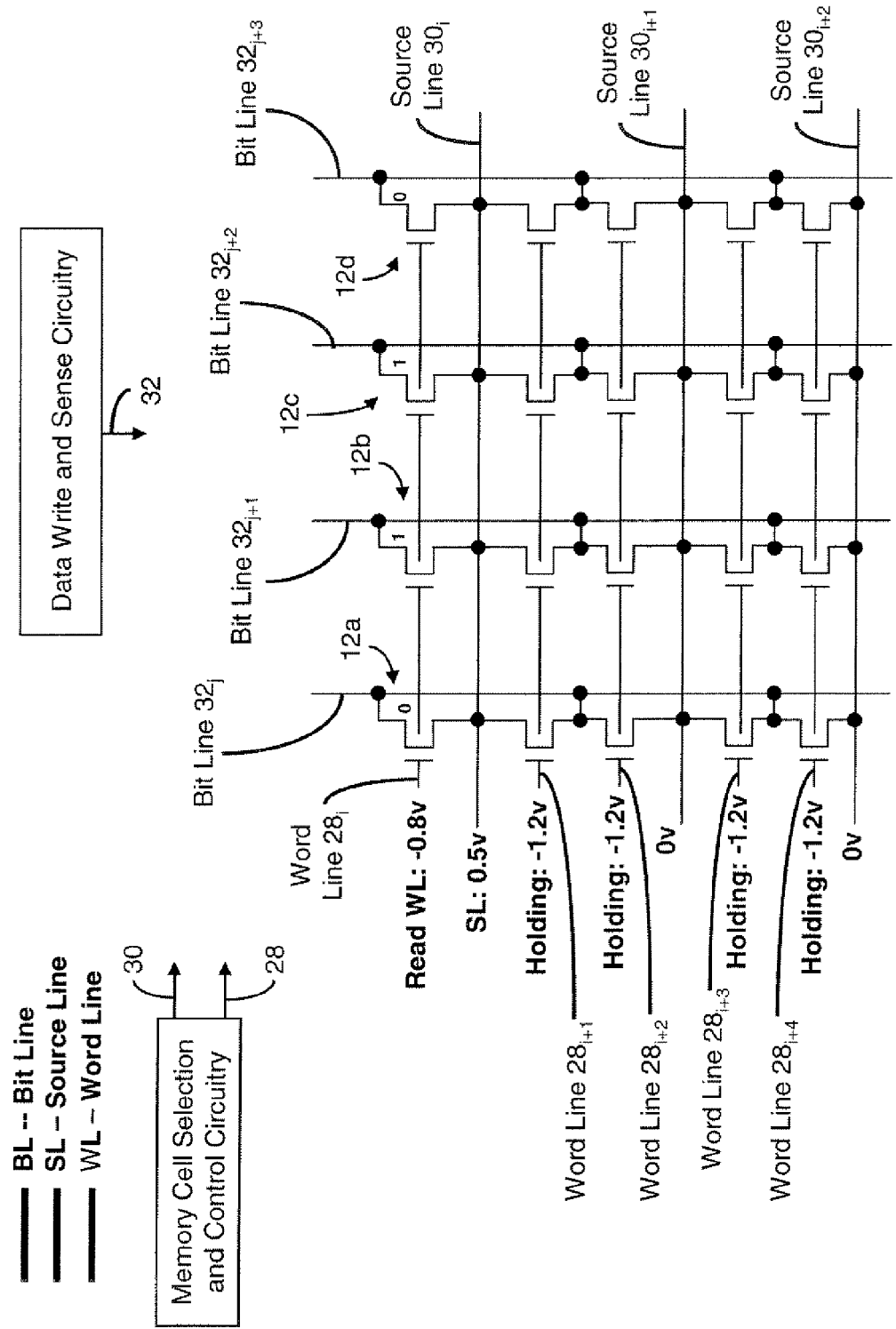

Again, from a relative timing perspective, it is preferred that the drain pulse be applied to drain region 22 of the transistors of memory cells 12b and 12c for a temporal period that is applied before, during and after the source and gate pulses, for example, initiates, starts, ramps, declines and/or terminates), (See, for example, FIGS. 6A and 6B).

Notably, with continued reference to FIGS. 6A, 6B, 7 and 9, for those unselected memory cells (i.e., the memory cells coupled to word lines $28_{i+1}$, $28_{i+2}$, $28_{i+2}$ and $28_{i+4}$), a holding condition may be applied or established to prevent, minimize and/or avoid disturbance of the data state of, or charge stored in the unselected memory cells. In this regard, a voltage (for example, −1.2V) may be applied to gates 16 of the transistors of the unselected memory cells and a voltage (for example, 0V) may be applied to source regions 20 and drain regions 22 of the transistors of the unselected memory cells to prevent, minimize or avoid disturbance of the data state in the unselected memory cells during the programming or writing operation. Under these conditions, the data state of the unselected memory cells may be unaffected (or substantially unaffected) by the programming of or writing to selected memory cells 12a-12d.

With reference to FIGS. 6A, 6B, 8 and 10, in the illustrated exemplary embodiments, control signals having a predetermined amplitude may be selectively applied to a row of memory cells (for example, memory cells 12a-12d which are coupled to word lines $28_i$) to read the data state in each of the selected memory cells 12a-12d. For example, a voltage pulse of +0.5V may be applied to source region 20, and a voltage pulse of −0.8V may be applied to gate 16 of the transistors of memory cells 12a-12d. In this embodiment, the source pulse may be applied to source region 20 before application of the gate pulse to gate 16, simultaneously thereto, or after the gate pulse is applied to gate 16 of the transistors of memory cells 12a-12d. Further, the source pulse may cease or terminate before the gate pulse, simultaneously thereto (as illustrated in FIGS. 6A and 6B), or after the gate pulse concludes or ceases.

Notably, for those memory cells that are not read (i.e., those memory cells coupled to word lines $28_{i+1}$, $28_{i+2}$, $28_{i+3}$ and $28_{i+4}$), a holding condition may be applied or established to prevent, minimize and/or avoid disturbance of the data state in the unselected memory cells. In this regard, a voltage (for example, −1.2V) may be applied to gates 16 of the transistors of the unselected memory cells and a voltage (for example, 0V) may be applied to source regions 20 of the transistors of the unselected memory cells to prevent, minimize or avoid disturbance of the data state in the unselected memory cells during the read operation. Under these conditions, the state of the unselected memory cells may be unaffected (or substantially unaffected) during the reading of selected memory cells 12a-12d.

Figure 11:
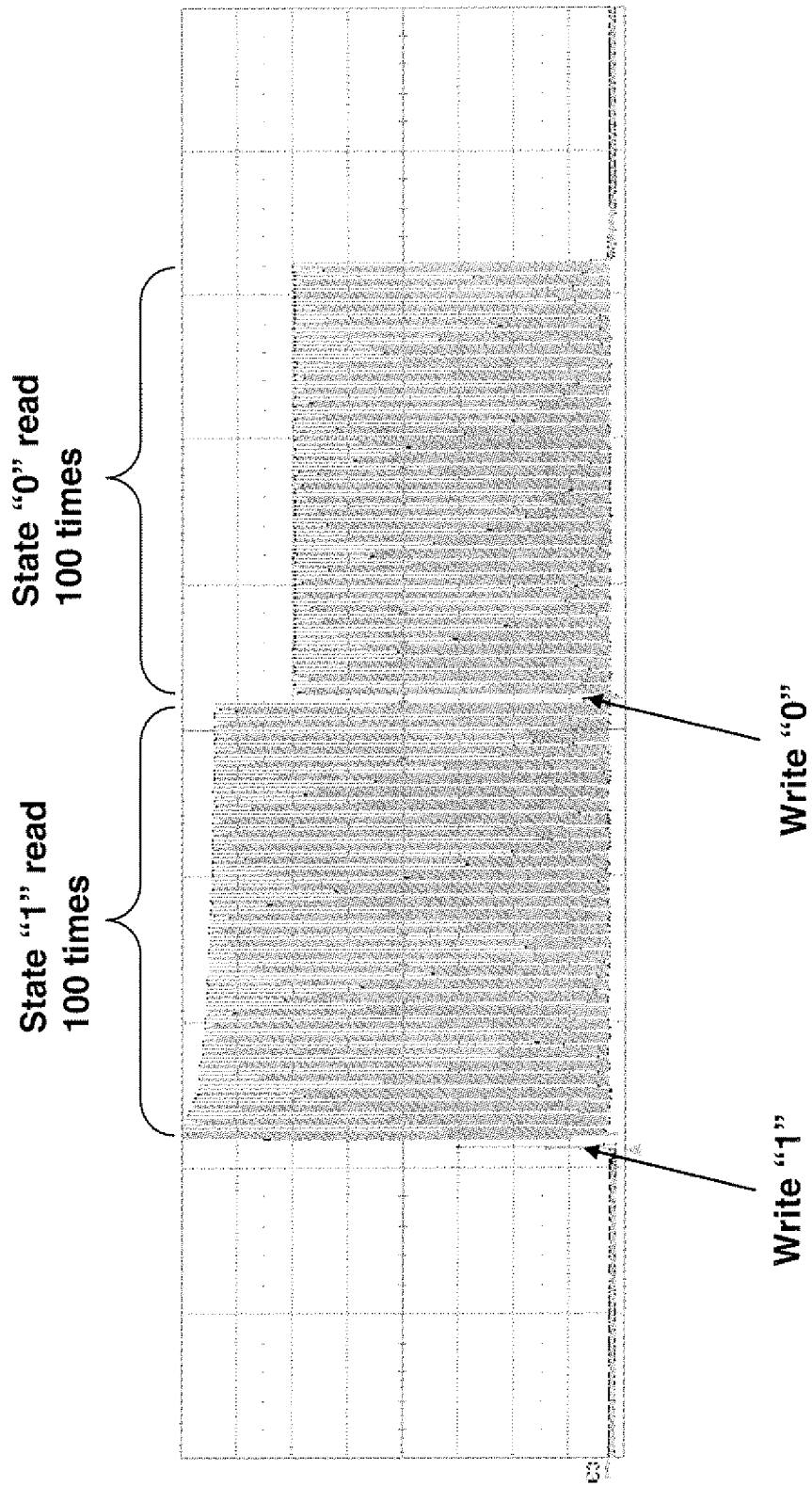
FIG. 11 illustrates non-disturbing reading of the proposed memory cell according to an exemplary embodiment of the present inventions.

With reference to FIG. 11, in an exemplary embodiment, reading may be performed many times in sequence without losing a detrimental amount of charge stored in the body region of the transistor. In this way, the memory cell may undergo multiple read operations without the loss of an amount of charge that would result in destruction of the data state (i.e., the data state of the memory cell being undeterminable by sensing circuitry, for example, a sense amplifier).

The illustrated/exemplary voltage levels to implement the write and read operations are merely exemplary. The indicated voltage levels may be relative or absolute. Alternatively, the voltages indicated may be relative in that each voltage level, for example, may be increased or decreased by a given voltage amount (for example, each voltage may be increased or decreased by 0.25, 0.5, 1.0 and 2.0 volts) whether one or more of the voltages (for example, the source, drain or gate voltages) become or are positive and negative.

Notably, the reading technique described herein may reduce the degradation of the charge in the electrically floating body which results from or is caused by charge-pumping (charge-pumping disturb). In this way, the memory cell provides a quasi non-disturbing reading. Thus, when memory cell 12 is read multiple times without or before a refresh operation, the read window remains relatively stable for each successive read operation. (See, for example, FIG. 11).

The memory cells of the memory array(s) may be comprised of N-channel, P-channel and/or both types of transistors. Further, circuitry that is peripheral to the memory array (for example, sense amplifiers or comparators, row and column address decoders, as well as line drivers (not illustrated herein)) may include P-channel and/or N-channel type transistors. Where P-channel type transistors are employed as memory cells 12 in the memory array(s), suitable write and read voltages (for example, negative voltages) are well known to those skilled in the art in light of this disclosure.

A memory cell which is includes an electrically floating body transistor, which state is read/programmed using the techniques of the present invention, may be employed in any array, architecture, layout, structure and/or configuration employing such memory cells. In this regard, an electrically floating body transistor, which state is programmed and/or read using the techniques of the present invention, may be implemented in the memory cell, architecture, layout, structure and/or configuration described and illustrated in the following non-provisional U.S. patent applications:

(1) U.S. Non-Provisional patent application Ser. No. 10/450,238, which was filed by Fazan et al. on Jun. 10, 2003 and entitled "Semiconductor Device" (now U.S. Pat. No. 6,969,662);

(2) U.S. Non-Provisional patent application Ser. No. 10/487,157, which was filed by Fazan et al. on Feb. 18, 2004 and entitled "Semiconductor Device" (now U.S. Pat. No. 7,061,050);

(3) U.S. Non-Provisional patent application Ser. No. 10/829,877, which was filed by Ferrant et al. on Apr. 22, 2004 and entitled "Semiconductor Memory Cell, Array, Architecture and Device, and Method of Operating Same" (now U.S. Pat. No. 7,085,153);

(4) U.S. Non-Provisional patent application Ser. No. 11/096,970, which was filed by Ferrant et al. and entitled "Semiconductor Memory Device and Method of Operating Same" (now U.S. Pat. No. 7,085,156);

(5) U.S. Non-Provisional patent application Ser. No. 10/941,692, which was filed by Fazan et al. on Sep. 15, 2004 and entitled "Low Power Programming Technique for a One Transistor SOI Memory Device & Asymmetrical Electrically Floating Body Memory Device, and Method of Manufacturing Same" (now U.S. Pat. No. 7,184,298);

The entire contents of these five (5) U.S. patent applications, including, for example, the inventions, features, attributes, architectures, configurations, materials, techniques and advantages described and illustrated therein, are hereby incorporated by reference herein. For the sake of brevity, those discussions will not be repeated; rather those discussions (text and illustrations), including the discussions relating to the memory cell, architecture, layout, structure, are incorporated by reference herein in its entirety.

Indeed, the memory cells of the present inventions may be implemented in any memory array having, for example, a plurality of rows and columns (for example, in a matrix form). Moreover, the present inventions may be implemented in any memory cell and/or memory cell array having an electrically floating body transistor. For example, the present inventions may be employed in a memory array, having a plurality of memory cells each including an electrically floating body transistor wherein such memory cells are written, controlled, programmed and/or read according to any of the techniques described and/or illustrated herein. The data states of adjacent memory cells and/or memory cells that share a word line may be individually and selectively programmed.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions. Indeed, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

For example, memory cells having P-type or N-type transistors (whether symmetrical or non-symmetrical and/or whether disposed on/in a bulk semiconductor material or an SOI material) may be employed in any of the embodiments described and/or illustrated herein. Indeed, all permutations and combinations of the memory cells with such embodiments and/or features thereof, are intended to come within the scope of the present inventions. For the sake of brevity, such permutations and combinations are not discussed in detail herein.

Notably, where the memory cells include at least one electrically floating body transistor to store a charge in the electrically floating body region, such transistors may be symmetrical or non-symmetrical. Where the transistor are symmetrical, the source and drain regions are essentially interchangeable. However, where the transistor are non-symmetrical device, the source or drain regions of transistors have different electrical, physical, doping concentration and/or doping profile characteristics. As such, the source or drain regions of a non-symmetrical device are typically not interchangeable. This notwithstanding, the drain region of the electrically floating N-channel type transistor of the memory cell (whether the source and drain regions are interchangeable or not) is that region of the transistor that is connected to the bit line/sense amplifier.

As mentioned above, the inventions (and embodiments thereof) described and illustrated herein are entirely applicable to N-channel and/or P-channel type transistors. Moreover, while the discussion described and illustrated only source and drain implants, other implants may also be included. For example, implants to modify the operation of memory cells 12, which affect, for example, the power consumption of memory cells 12 as described and illustrated in (1) U.S. Pat. No. 6,969,662 (identified above), (2) U.S. Pat. No. 7,061,050 (identified above), and (3) Provisional Application Ser. No. 60/578,631, which was filed on Jun. 10, 2004 and entitled "Asymmetrical Electrically Floating Body Memory Device, and Method of Manufacturing Same".

Further, as mentioned above, the memory arrays may be comprised of N-channel type transistors, P-channel type transistors and/or both types of transistors, as well as partially depleted and/or fully depleted type transistors. For example, circuitry that is peripheral to the memory array (for example, sense amplifiers or comparators, row and column address decoders, as well as line drivers (not illustrated herein)) may include fully depleted type transistors (whether P-channel and/or N-channel type). Alternatively, such circuitry may include partially depleted type transistors (whether P-channel and/or N-channel type). There are many techniques to integrate both partially depleted and/or fully depleted type transistors on the same substrate (see, for example, U.S. Pat. No. 7,061,050). All such techniques, whether now known or later developed, are intended to fall within the scope of the present inventions.

Notably, memory cell selection circuitry may employ any circuitry and/or technique now known or later developed to select one or more memory cells for reading and/or programming. Indeed, all such techniques and circuitry therefor, whether now known or later developed, are intended to fall within the scope of the present inventions.

Further, data write and sense circuitry may employ any circuitry whether now known or later developed. For example, the data write and sense circuitry may employ a sense amplifier to read the data stored in memory cells 12. The sense amplifier may sense the data state stored in memory cell 12 using voltage or current sensing techniques. In the context of a current sense amplifier (for example, Non-Provisional U.S. patent application Ser. No. 11/299,590 (U.S. Patent Application Publication US 2006/0126374), filed by Waller and Carman, on Dec. 12, 2005 and entitled "Sense Amplifier Circuitry and Architecture to Write Data into and/or Read Data from Memory Cells", the sense amplifier may compare the memory cell current to a reference current, for example, the current of a reference cell. From that comparison, the data state of memory cell 12 may be determined (for example, whether the memory cell 12 contained a logic high (relatively more majority carries 34 contained within body region 18) or logic low data state (relatively less majority carries 34 contained within body region 18)).

The reference current or voltage may be substantially equal to one-half of the summation of the currents in a first reference cell, which has a logic low data state, and a second reference cell, which has a logic high data state. Other reference current or voltage levels are suitable. Moreover, a reference generator circuitry is described in the context of generating, providing and/or supplying a reference current or voltage. The circuitry and techniques described and illustrated in U.S. patent application Ser. No. 10/840,902, which was filed by Portmann et al. on May 7, 2004, and entitled "Reference Current Generator, and Method of Programming, Adjusting and/or Operating Same" (now U.S. Pat. No. 6,912, 150), may be employed to generate an appropriate reference current for the data write and sense circuitry. The entire contents of U.S. patent application Ser. No. 10/840,902, including, for example, the inventions, features, attributes, architectures, configurations, materials, techniques and advantages described and illustrated therein, are hereby incorporated by reference herein.

In addition, the circuitry and techniques described and illustrated in U.S. patent application Ser. No. 11/515,667 (U.S. Patent Application Publication US 2007/0064489), which was filed by Bauser on Sep. 5, 2006, and entitled "Method and Circuitry to Generate a Reference Current for Reading a Memory Cell, and Device Implementing Same", may be employed to generate an appropriate reference current for the data write and sense circuitry. The entire contents of U.S. patent application Ser. No. 11/515,667, including, for example, the inventions, features, attributes, architectures, configurations, materials, techniques and advantages described and illustrated therein, are hereby incorporated by reference herein. Notably, all such techniques and circuitry to generate an appropriate reference current for the data write and sense circuitry, whether now known or later developed, are intended to fall within the scope of the present inventions.

Further, although the present inventions have been described in the exemplary embodiments as a single-bit memory cell, the present inventions may be implemented in memory cells that store more than one bit of data. For example, the present inventions may be implemented in conjunction with the inventions, embodiments, memory cells, memory cell arrays and architectures described and/or illustrated in U.S. Non-Provisional patent application Ser. No. 11/703,429, which was filed by Okhonin et al, on Feb. 7, 2007, and entitled "Multi-Bit Memory Cell Having Electrically Floating Body Transistor, and Method of Programming and Reading Same". In this regard, the multi-bit memory cell, and circuitry and techniques for reading, writing and/or operating a multi-bit memory cell (and memory cell array having a plurality of such memory cells as well as an integrated circuit device including a memory cell array) may be programmed using the techniques described and illustrated herein. The multi-bit memory cell stores more than one data bit (for example, two, three, four, five, six, etc.) and/or more than two data states (for example, three, four, five, six, etc. data or logic states).

An analog-to-digital converter circuitry and/or one or more sense amplifiers (not illustrated) may be employed to read the multi-bit data stored in a memory cell (having an electrically floating body transistor). The sense amplifier may sense the data state stored in the memory cell using voltage or current sensing techniques. In the context of a current sense amplifier, the current sense amplifier may compare the cell current to one or more reference currents, for example, the current of a reference cell (not illustrated). From that comparison, the data state of the memory cell may be determined (which is indicative of the number of majority carriers contained within electrically floating body region of the transistor).

Further, the present inventions may employ the circuitry and techniques for independently controlling certain parameters (for example, temporal or voltage), for a memory operation (for example, restore, write, refresh), to program or write a predetermined data state into a memory cell (for example, programming or writing data state "1" or "0" into a memory cell) as described and illustrated in U.S. patent application Ser. No. 11/590,147, which was filed by Popoff et al. on Oct. 31, 2006, and entitled "Method and Apparatus for Varying the Programming Duration and/or Voltage of an Electrically Floating Body Transistor, and Memory Cell Array Implementing Same". For example, the duration of programming/ writing/refreshing of a given memory state into a memory cell by data write and sense circuitry may be controlled, adjusted, determined and/or predetermined according to or based on the given memory operation (for example, restore, write, refresh). Likewise, the voltage conditions applied to the memory cell for programming/writing a given memory state into a memory cell by data write and sense circuitry may be controlled and/or adjusted according to the memory operation (for example, restore, write, refresh). The entire contents of U.S. patent application Ser. No. 11/590,147, including, for example, the inventions, features, attributes, architectures, configurations, materials, techniques and advantages described and illustrated therein, are hereby incorporated by reference herein.

The transistors, memory cells and arrays may be fabricated using well known techniques and/or materials. Indeed, any fabrication technique and/or material, whether now known or later developed, may be employed to fabricate the memory cells, transistors and/or memory array(s). For example, the present inventions may employ silicon (whether bulk-type or SOI), germanium, silicon/germanium, gallium arsenide or any other semiconductor material in which transistors may be formed. Indeed, the electrically floating body transistors, memory cells, and/or memory array(s) may employ the techniques described and illustrated in non-provisional patent application entitled "Integrated Circuit Device, and Method of Fabricating Same", which was filed on Jul. 2, 2004, by Fazan, Ser. No. 10/884,481 (U.S. Patent Application Publication US 2005/0017240) and/or non-provisional patent application entitled "One Transistor Memory Cell having a Strained Electrically Floating Body Region, and Method of Operating Same", which was filed on Oct. 12, 2006, and assigned Ser. No. 11/580,169, by Bassin (hereinafter collectively "Integrated Circuit Device Patent Applications"). The entire contents of the Integrated Circuit Device Patent Applications, including, for example, the inventions, features, attributes, architectures, configurations, materials, techniques and advantages described and illustrated therein, are hereby incorporated by reference herein.

Indeed, the memory array (including, for example, SOI memory transistors) may be integrated with SOI logic transistors, as described and illustrated in the Integrated Circuit Device Patent Applications. For example, in one embodiment, an integrated circuit device includes memory section (having, for example, PD or FD SOI memory transistors) and logic section (having, for example, high performance transistors, such as FinFET, multiple gate transistors, and/or non-high performance transistors (for example, single gate transistors that do not possess the performance characteristics of high performance transistors—not illustrated)). Again, the entire contents of the Integrated Circuit Device Patent Applications, including, for example, the inventions, features, attributes, architectures, configurations, materials, techniques and advantages described and illustrated therein, are hereby incorporated by reference.

Figure 12A:
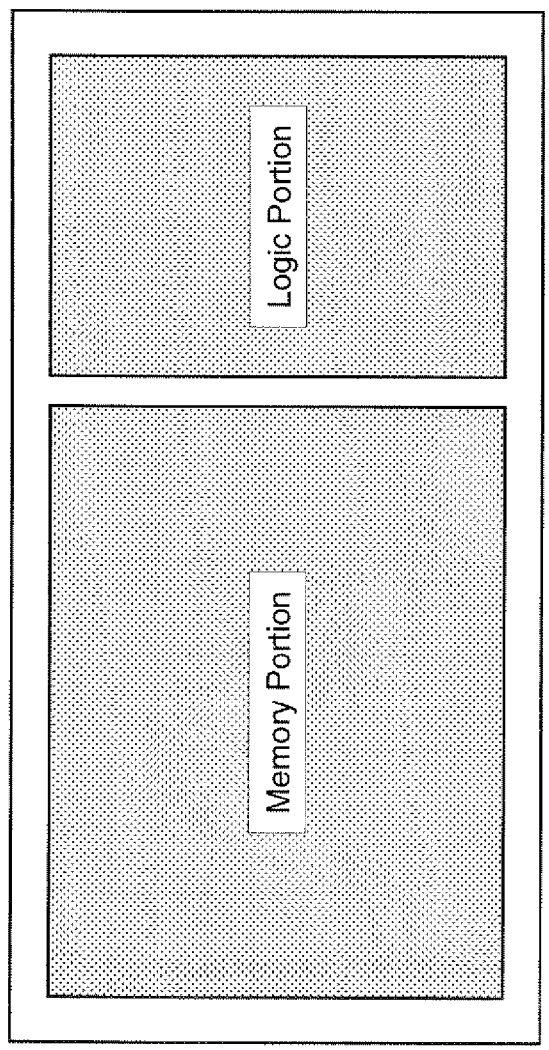
FIGS. 12A-12C are schematic block diagram illustrations of exemplary integrated circuit devices in which the memory cell array (and certain peripheral circuitry) may be implemented, according to one or more aspects of the present inventions.
Figure 12B:
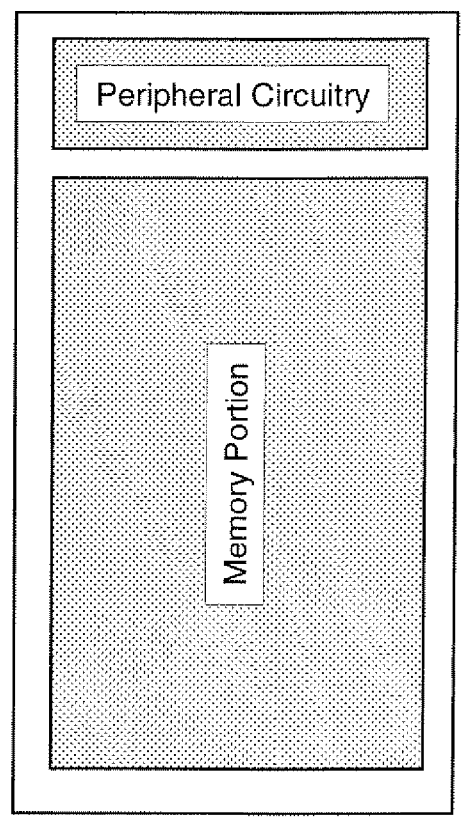
Figure 12C:
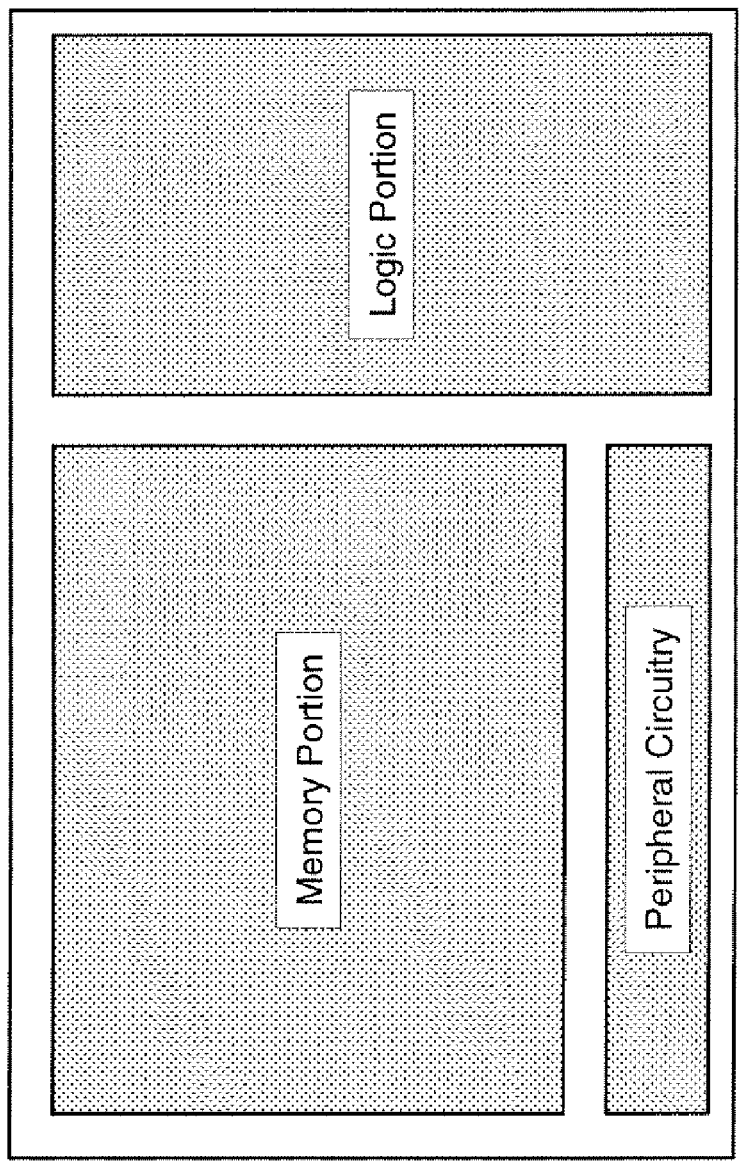

As noted above, the memory cell and/or memory cell array, as well as the circuitry of the present inventions may be implemented in an integrated circuit device having a memory portion and a logic portion (see, for example, FIGS. 12A and 12C), or an integrated circuit device that is primarily a memory device (see, for example, FIG. 12B). The memory array may include a plurality of memory cells arranged in a plurality of rows and columns wherein each memory cell includes a transistor (whether fabricated in a bulk-type material or SOI material), for example, an electrically floating body transistor. The memory arrays may be comprised of N-channel, P-channel and/or both types of transistors. Indeed, circuitry that is peripheral to the memory array (for example, data sense circuitry (for example, sense amplifiers or comparators), memory cell selection and control circuitry (for example, word line and/or source line drivers), as well as row and column address decoders) may include P-channel and/or N-channel type transistors.

Further, circuitry that is peripheral to the memory array may be comprised of N-channel, P-channel and/or both types of transistors, as well as partially depleted and/or fully depleted type transistors. For example, sense amplifiers or comparators, row and column address decoders, as well as line drivers (not illustrated herein) may include fully depleted type transistors (whether P-channel and/or N-channel type). Alternatively, such circuitry may include partially depleted type transistors (whether P-channel and/or N-channel type). There are many techniques to integrate both partially depleted and/or fully depleted type transistors on the same substrate (see, for example, U.S. Non-Provisional patent application Ser. No. 10/487,157 (U.S. Patent Application Publication No. 2004/0238890), which was filed by Fazan et al. on Feb. 18, 2004 and entitled "Semiconductor Device". All such techniques, whether now known or later developed, are intended to fall within the scope of the present inventions.

As mentioned above, transistors of the memory cells may be a symmetrical or non-symmetrical device. Where transistor is symmetrical, the source and drain regions are essentially interchangeable. However, where transistor is a non-symmetrical device, the source or drain regions of transistor have different electrical, physical, doping concentration and/or doping profile characteristics. As such, the source or drain regions of a non-symmetrical device are typically not interchangeable. This notwithstanding, the drain region of the electrically floating N-channel transistor of the memory cell (whether the source and drain regions are interchangeable or not) is that region of the transistor that is connected to the bit line/sense amplifier.

It should be noted that while each memory cell in the exemplary embodiments (described above) includes one transistor, the memory cell may include two transistors, as described and illustrated in application Ser. No. 10/829,877, which was filed by Ferrant et al. on Apr. 22, 2004 and entitled "Semiconductor Memory Cell, Array, Architecture and Device, and Method of Operating Same" (U.S. Patent Application Publication No. US 2005/0013163). For the sake of brevity, those discussions will not be repeated.

The above embodiments of the inventions are merely exemplary. They are not intended to be exhaustive or to limit the inventions to the precise forms, techniques, materials and/or configurations disclosed. Many modifications and variations are possible in light of this disclosure. For example, as mentioned above, the illustrated/exemplary voltage levels to implement the read and write operations are merely exemplary. The indicated voltage levels may be relative or absolute. Alternatively, the voltages indicated may be relative in that each voltage level, for example, may be increased or decreased by a given voltage amount (for example, each voltage may be increased or decreased by 0.1, 0.15, 0.25, 0.5, 1, 2 (etc) volts) whether one or more of the voltages (for example, the source, drain or gate voltages) become or are positive and negative.

It is to be understood that other embodiments may be utilized and operational changes may be made without departing from the scope of the present inventions. As such, the scope of the inventions is not limited solely to the description above because the description of the above embodiments has been presented for the purposes of illustration and description.

It should be noted that the term "circuit" means, among other things, a single component or a multiplicity of components (whether in integrated circuit form or otherwise), which are active and/or passive, and which are coupled together to provide or perform a desired operation. The term "circuitry" means, among other things, a circuit (whether integrated or otherwise), or a group of circuits (whether integrated or otherwise). The term "to sense a/the data state stored in memory cell" means, among other things, to sample, to sense, to read and/or to determine a/the data state stored in memory cell; "sensing a/the data state stored in memory cell", "sensed a/the data state stored in memory cell" or the like shall have the same meaning.

What is claimed is:

1. A method for biasing an integrated circuit device comprising:
applying a plurality of voltage potentials to a memory cell including at least one transistor, wherein applying a plurality of voltage potentials to a memory cell comprises:
applying a first voltage potential to a first region via a source line;
applying a second voltage potential to a second region via a bit line;
applying a third voltage potential to a body region via a word line coupled to a gate disposed over the body region, wherein the body region includes a storage node disposed between the first region and the second region, wherein the storage node of the body region is:

(i) located, at least in part, immediately beneath the gate and (ii) separated from portions of the body region by abutting or overlapping first and second junctions of the transistor.

2. The method of claim 1, wherein the memory cell comprises a gate insulator disposed between the gate and the body region.

3. The method of claim 2, further comprising increasing the first voltage applied to the source line from the first voltage potential applied to the source line during a hold operation to perform a write logic low operation.

4. The method of claim 3, further comprising increasing the second voltage potential applied to the bit line from the second voltage potential applied to the bit line during the hold operation to perform the write logic low operation.

5. The method of claim 4, further comprising increasing the third voltage potential applied to the word line from the third voltage potential applied to the word line during the hold operation to perform the write logic low operation.

6. The method of claim 5, wherein the second voltage potential applied to the bit line is equal to the third voltage potential applied to the word line during the write logic low operation.

7. The method of claim 5, wherein the second voltage potential applied to the bit line is higher than the third voltage potential applied to the word line during the write logic low operation.

8. The method of claim 5, wherein the second voltage potential applied to the bit line is increased before an increase of the first voltage potential applied to the source line and an increase of the third voltage potential applied to the word line during the write logic low operation.

9. The method of claim 2, further comprising increasing the first voltage applied to the source line from the first voltage potential applied to the source line during a hold operation to perform a write logic high operation.

10. The method of claim 9, further comprising maintaining the second voltage potential applied to the bit line at the second voltage potential applied to the bit line during the hold operation to perform the write logic high operation.

11. The method of claim 10, further comprising increasing the third voltage potential applied to the word line from the third voltage potential applied to the word line during the hold operation to perform the write logic high operation.

12. The method of claim 10, wherein the third voltage potential applied to the word line is higher than the second voltage potential applied to the bit line during the write logic high operation.

13. The method of claim 10, wherein the third voltage potential applied to the word line is lower than the second voltage potential applied to the bit line during the write logic high operation.

14. The method of claim 2, wherein increasing the first voltage applied to the source line from the first voltage potential applied to the source line during a hold operation to perform a read operation.

15. The method of claim 14, further comprising maintaining the second voltage potential applied to the bit line at the second voltage potential applied to the bit line during the hold operation to perform the read operation.

16. The method of claim 15, further comprising increasing the third voltage potential applied to the word line from the third voltage potential applied to the word line during the hold operation to perform the read operation.

17. The method of claim 16, wherein the second voltage potential applied to the bit line is higher than the third voltage potential applied to the word line during the read operation.

18. The method of claim 17, wherein, in response to the read operation, the transistor generates a punch-through current which is representative of a data state of the memory cell, and wherein data sense circuitry determines the data state of the memory cell at least substantially based on the punch-through current.

19. The method of claim 1, wherein the body region of the transistor is electrically floating.

20. The method of claim 1, wherein the transistor is disposed in or on a semiconductor region or layer which resides on or above an insulating region or layer of a substrate, wherein the body region is disposed between the first region, the second region, a gate insulator, and the insulating region or layer of the substrate.

* * * * *